US007907921B2

(12) United States Patent
Pan

(10) Patent No.: US 7,907,921 B2
(45) Date of Patent: *Mar. 15, 2011

(54) WIRELESS TRANSMITTER HAVING MULTIPLE POWER AMPLIFIER DRIVERS (PADS) THAT ARE SELECTIVELY BIASED TO PROVIDE SUBSTANTIALLY LINEAR MAGNITUDE AND PHASE RESPONSES

(75) Inventor: Meng-An Pan, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/457,542

(22) Filed: Jun. 15, 2009

(65) Prior Publication Data

US 2009/0318100 A1 Dec. 24, 2009

Related U.S. Application Data

(63) Continuation of application No. 11/094,758, filed on Mar. 31, 2005, now Pat. No. 7,548,733.

(51) Int. Cl.
*H01Q 11/12* (2006.01)
*H04B 1/04* (2006.01)

(52) U.S. Cl. ............... 455/127.3; 455/114.2; 330/124 R

(58) Field of Classification Search ............... 455/114.2, 455/114.3, 127.1, 127.2, 127.3; 375/296–297, 375/312; 330/124 R
See application file for complete search history.

(56) References Cited

U.S. PATENT DOCUMENTS

| 3,739,292 | A | | 6/1973 | Furuhashi |
| 5,438,684 | A | * | 8/1995 | Schwent et al. ........... 455/552.1 |
| 5,565,813 | A | | 10/1996 | Connell et al. |
| 5,942,939 | A | * | 8/1999 | Finol et al. .................... 330/149 |
| 5,994,955 | A | * | 11/1999 | Birkeland ....................... 330/51 |
| 6,181,204 | B1 | * | 1/2001 | Smith et al. .................... 330/261 |
| 6,188,281 | B1 | * | 2/2001 | Smith et al. .................... 330/252 |
| 6,366,166 | B1 | * | 4/2002 | Belot ............................ 330/252 |
| 6,774,717 | B2 | * | 8/2004 | Hellberg ................... 330/124 R |
| 6,812,771 | B1 | | 11/2004 | Behel et al. |
| 6,831,511 | B2 | * | 12/2004 | Hollingsworth et al. . 330/124 R |
| 6,888,411 | B2 | * | 5/2005 | Behzad et al. ................ 330/311 |
| 7,039,381 | B2 | | 5/2006 | Yang et al. |
| 7,145,390 | B2 | * | 12/2006 | Pan .............................. 330/261 |
| 7,184,735 | B2 | | 2/2007 | Bhatti et al. |
| 7,199,659 | B2 | | 4/2007 | Pan |
| 7,248,110 | B2 | * | 7/2007 | Dittmer et al. ........... 330/124 R |
| 7,548,733 | B2 | * | 6/2009 | Pan ............................ 455/127.3 |
| 2002/0067211 | A1 | * | 6/2002 | Matsuyoshi et al. .......... 330/301 |
| 2002/0175763 | A1 | * | 11/2002 | Dasgupta et al. ............. 330/301 |

(Continued)

*Primary Examiner* — Edward Urban
*Assistant Examiner* — RuiMeng Hu
(74) *Attorney, Agent, or Firm* — Sterne, Kessler, Goldstein & Fox, P.L.L.C.

(57) ABSTRACT

A method and apparatus are provided for enabling a transmitter to have a substantially linear magnitude response and a substantially linear phase response. The transmitter includes first and second power amplifier drivers (PADs) having respective first and second non-linear phase responses. The first non-linear phase response is based on a first bias applied to the first PAD, and the second non-linear phase response is based on a second bias applied to the second PAD. The first and second PADs are coupled in parallel to provide a combined substantially linear phase response. According to an embodiment, the first and second PADs have respective first and second average input capacitances. Signal swings about the first and second biases vary the respective first and second average input capacitances, which may be combined to provide a combined average input capacitance that is substantially insensitive to the signal swings about the first and second biases.

17 Claims, 30 Drawing Sheets

U.S. PATENT DOCUMENTS

| | | | |
|---|---|---|---|
| 2002/0186079 A1* | 12/2002 | Kobayashi | 330/124 R |
| 2003/0011434 A1 | 1/2003 | Luo et al. | |
| 2003/0067359 A1 | 4/2003 | Darabi et al. | |
| 2003/0231061 A1* | 12/2003 | Lautzenhiser et al. | 330/295 |
| 2004/0150473 A1* | 8/2004 | Hollingsworth et al. | 330/124 R |
| 2004/0222851 A1* | 11/2004 | Weldon | 330/151 |
| 2005/0012547 A1* | 1/2005 | Kwon et al. | 330/124 R |
| 2006/0028275 A1* | 2/2006 | Bhattacharjee et al. | 330/254 |
| 2006/0049870 A1* | 3/2006 | Hellberg | 330/136 |
| 2006/0050809 A1* | 3/2006 | Pan | 375/297 |
| 2006/0052071 A1* | 3/2006 | Pan | 455/127.3 |
| 2006/0164164 A1* | 7/2006 | Rogers et al. | 330/252 |
| 2006/0178165 A1* | 8/2006 | Vassiliou et al. | 455/552.1 |
| 2006/0217090 A1* | 9/2006 | Pan | 455/127.4 |
| 2006/0220738 A1* | 10/2006 | Pan | 330/126 |
| 2006/0255857 A1* | 11/2006 | Parker et al. | 330/84 |
| 2007/0057722 A1* | 3/2007 | Kwon et al. | 330/53 |

* cited by examiner

| Constellation Point | Bit Combination |
|---|---|
| 210a | 0000 |
| 210b | 0001 |
| 210c | 0010 |
| 210d | 0011 |
| 210e | 0100 |
| 210f | 0101 |
| 210g | 0110 |
| 210h | 0111 |
| 210i | 1000 |
| 210j | 1001 |
| 210k | 1010 |
| 210l | 1011 |
| 210m | 1100 |
| 210n | 1101 |
| 210o | 1110 |
| 210p | 1111 |

FIG. 2A

WIRELESS TRANSMITTER HAVING MULTIPLE POWER AMPLIFIER DRIVERS (PADS) THAT ARE SELECTIVELY BIASED TO PROVIDE SUBSTANTIALLY LINEAR MAGNITUDE AND PHASE RESPONSES

CROSS-REFERENCE TO RELATED APPLICATIONS

This application is a continuation of U.S. patent application Ser. No. 11/094,758, filed on Mar. 31, 2005, which is incorporated herein in by reference in its entirety.

BACKGROUND OF THE INVENTION

1. Field of the Invention

The present invention generally relates to transmitters, and more specifically to wireless transmitters.

2. Background

Conventional wireless transmitters are designed with an emphasis on gain linearity (also referred to as magnitude linearity), which is only one factor in the performance of a transmitter. An often overlooked factor is phase linearity. Even if a conventional wireless transmitter is capable of achieving a linear magnitude response, the phase response of the transmitter typically is not linear. Phase response generally is not considered in the design of a wireless transmitter because sources of phase non-linearity are difficult to determine.

What is needed, then, is a wireless transmitter that is capable of providing a substantially linear magnitude response and a substantially linear phase response.

BRIEF SUMMARY OF THE INVENTION

The present invention provides a method and apparatus for enabling a transmitter to provide a substantially linear magnitude response and a substantially linear phase response. In particular, an embodiment of the present invention provides a method and apparatus for combining first and second non-linear phase responses of respective first and second PADs that are coupled in parallel with each other to provide a combined substantially linear phase response.

According to an embodiment, the first non-linear phase response is based on a first bias applied to the first PAD, and the second non-linear phase response is based on a second bias applied to the second PAD. For example, the first bias may be a gate-to-source voltage of the first PAD, and the second bias may be a gate-to-source voltage of the second PAD. In an embodiment, the first bias corresponds to a lower biasing threshold of the first PAD, and the second bias corresponds to an upper biasing threshold of the second PAD.

The first and second biases may be selected based on an error vector magnitude associated with the first and second biases. For example, a three-dimensional plot of the error vector magnitude versus the first bias versus the second bias may indicate a suitable biasing point for the first and second PADs to achieve a substantially linear magnitude response and/or a substantially linear phase response.

The first and second PADs have respective first and second average input capacitances. In an embodiment, the first average input capacitance varies based on a signal swing about the first bias, and the second average input capacitance varies based on a signal swing about the second bias. For example, a signal swing having a greater amplitude may cause a greater variation of the first or second average input capacitance. The parallel combination of the first and second PADs may have a combined average input capacitance that is substantially insensitive to the signal amplitude.

According to an embodiment, the first average input capacitance is one specific function of the signal swing of the first bias, and the second average input capacitance is another specific function of the signal swing of the second bias. In an embodiment, the first average input capacitance is directly proportional to the amplitude of the signal swing about the first bias, and the second average input capacitance is inversely proportional to the amplitude of the signal swing about the second bias.

In an embodiment, the first and second PADs operate in different classes. For example, the first PAD may operate in a class selected from the group consisting of A, B, and AB, and the second PAD may operates in a different class selected from the group.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate embodiments of the present invention and, together with the description, further serve to explain the principles of the invention and to enable a person skilled in the pertinent art(s) to make and use the invention. In the drawings, like reference numbers indicate identical or functionally similar elements. Additionally, the leftmost digit(s) of a reference number identifies the drawing in which the reference number first appears.

Figure 2:
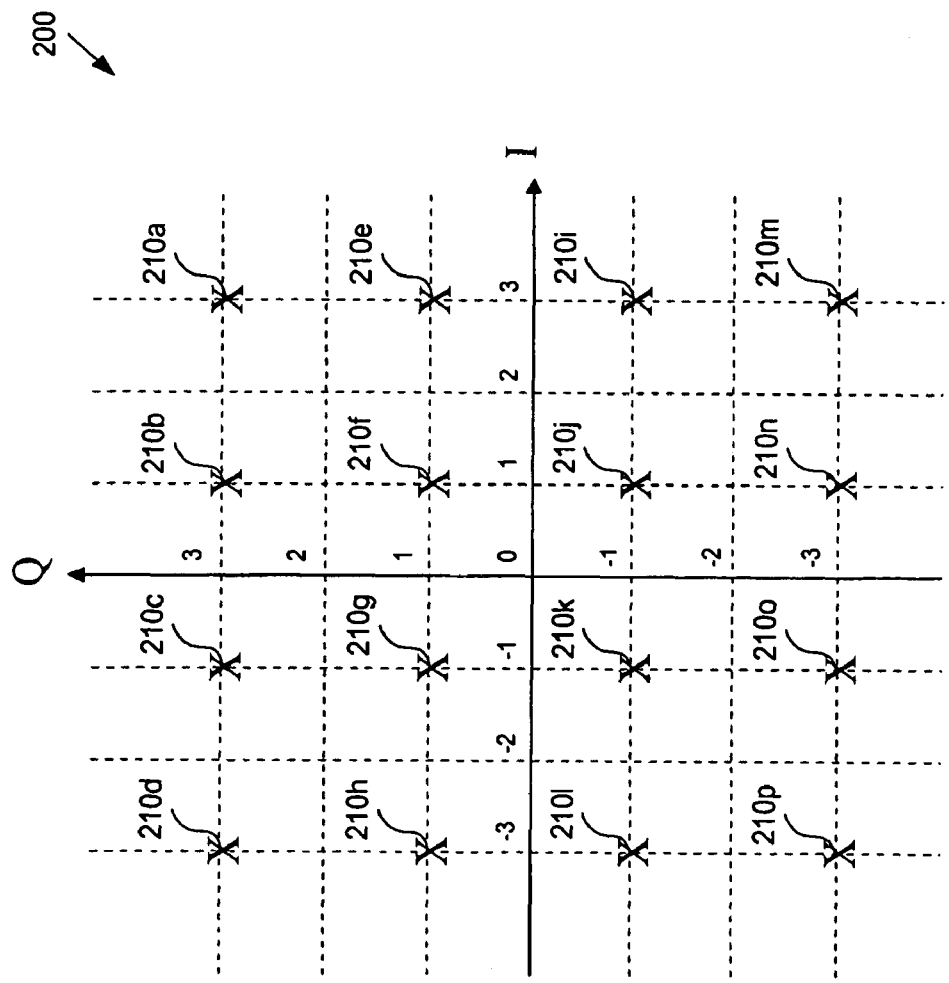
FIG. 2 illustrates a constellation showing a relationship between in-phase and quadrature components from a baseband processor that have been modulated in accordance with a sixteen quadrature amplitude modulation (16 QAM) technique according to an embodiment of the present invention.

FIG. 2A provides an example table showing the relationship between bit combinations and points in the constellation shown in FIG. 2 according to an embodiment of the present invention.

Figure 3:
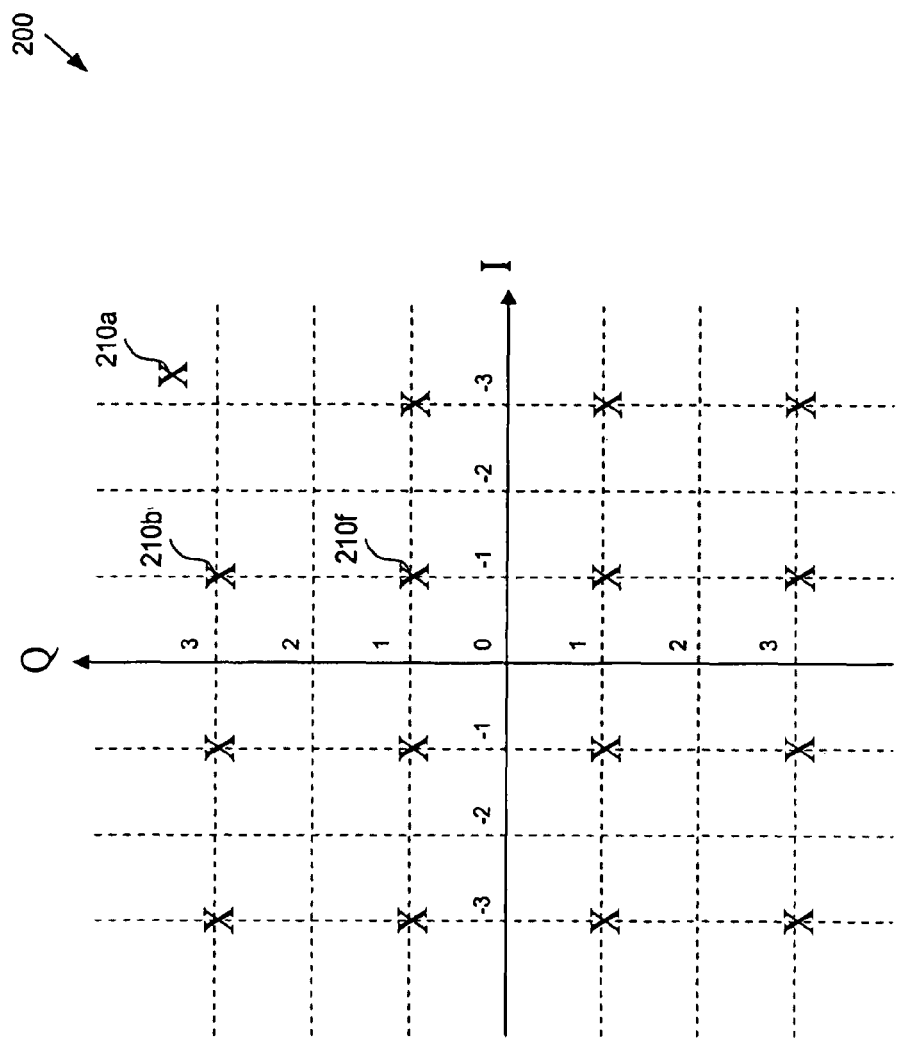

FIG. 3 illustrates the constellation of FIG. 2 showing magnitude distortion according to an embodiment of the present invention.

Figure 4:
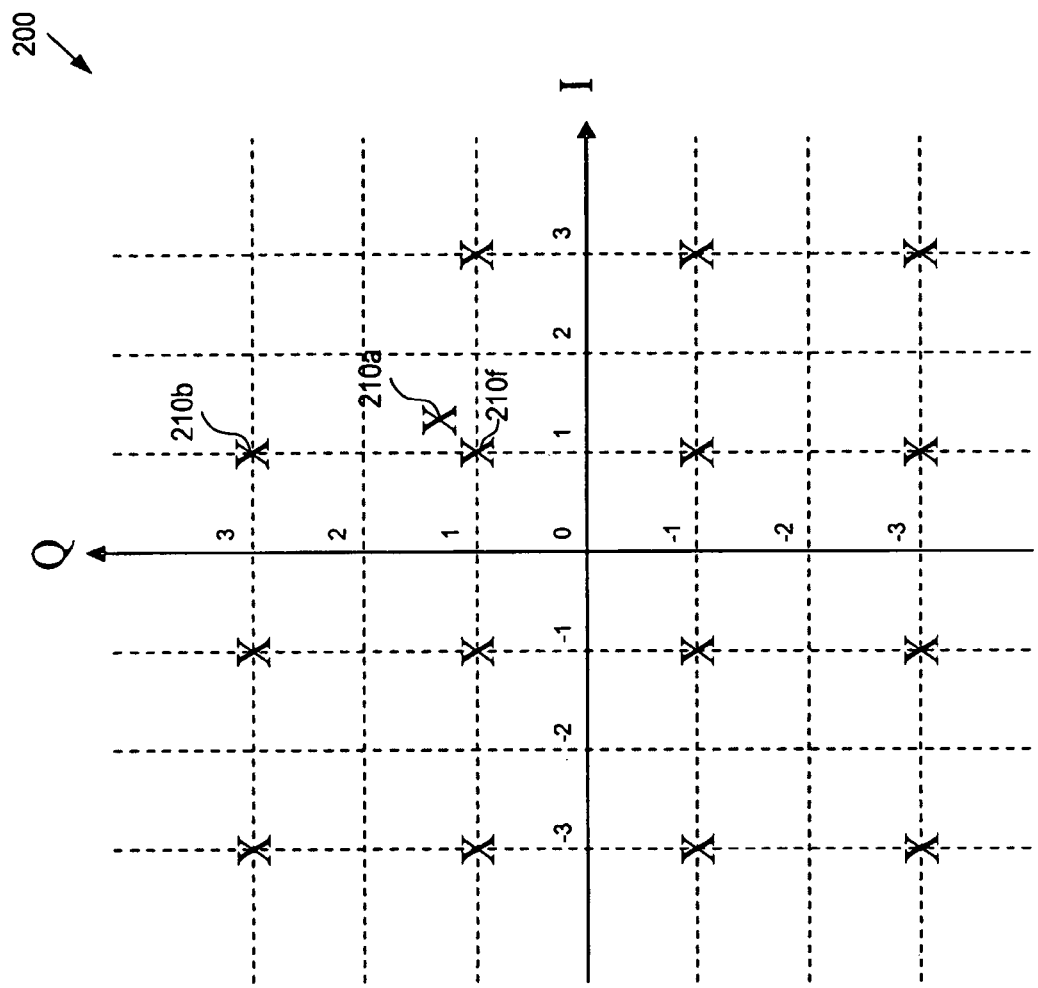

FIG. 4 illustrates the constellation of FIG. 2 showing magnitude distortion according to another embodiment of the present invention.

Figure 5:
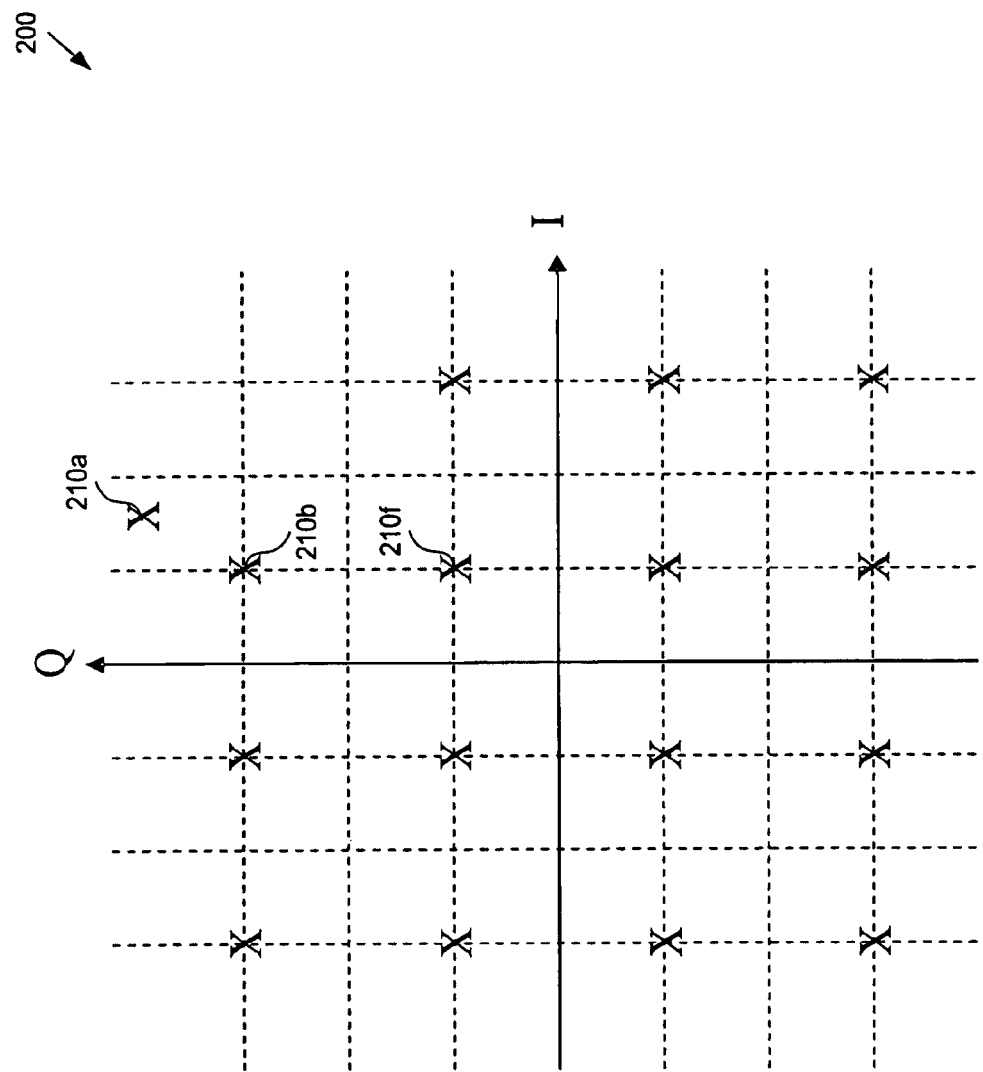

FIG. 5 illustrates the constellation of FIG. 2 showing phase distortion according to an embodiment of the present invention.

Figure 1:
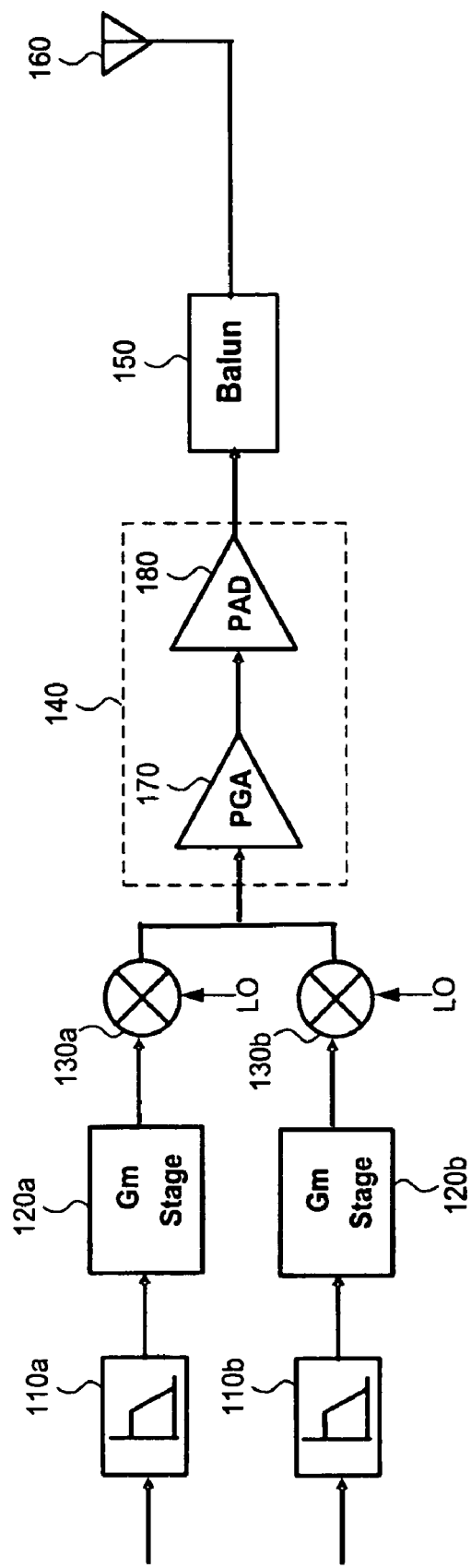
FIG. 1 is a block diagram of an example transmitter according to an embodiment of the present invention.
Figure 6:
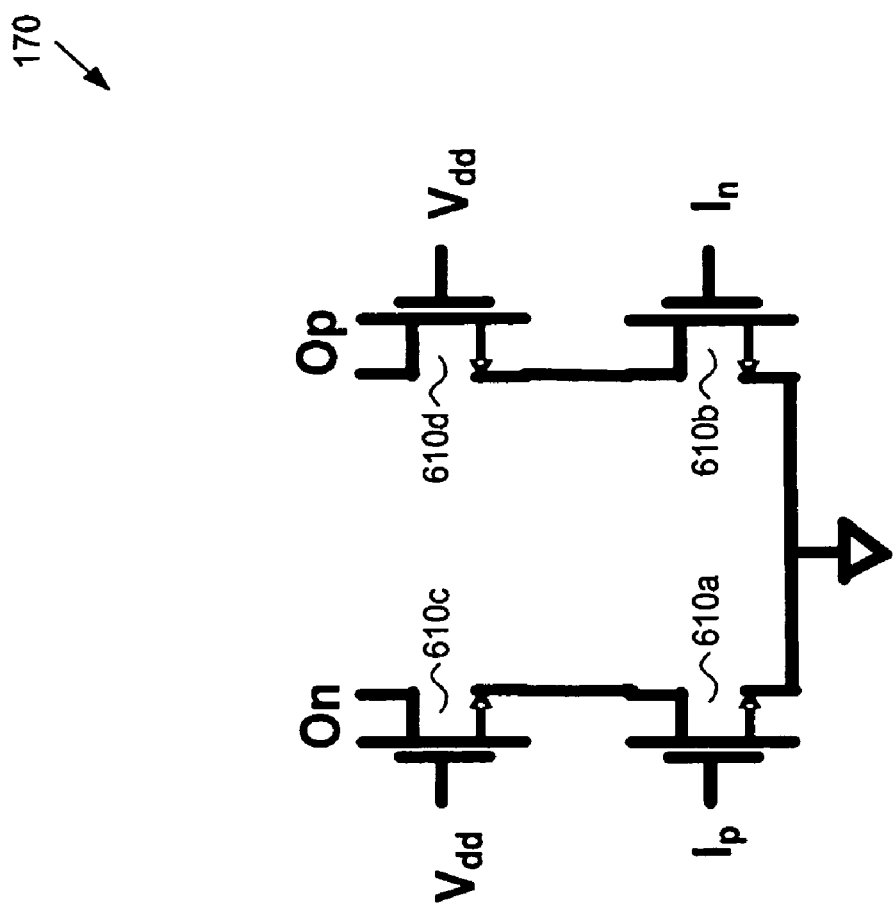

FIG. 6 is an example schematic of the PGA shown in FIG. 1 according to an embodiment of the present invention.

Figure 7:
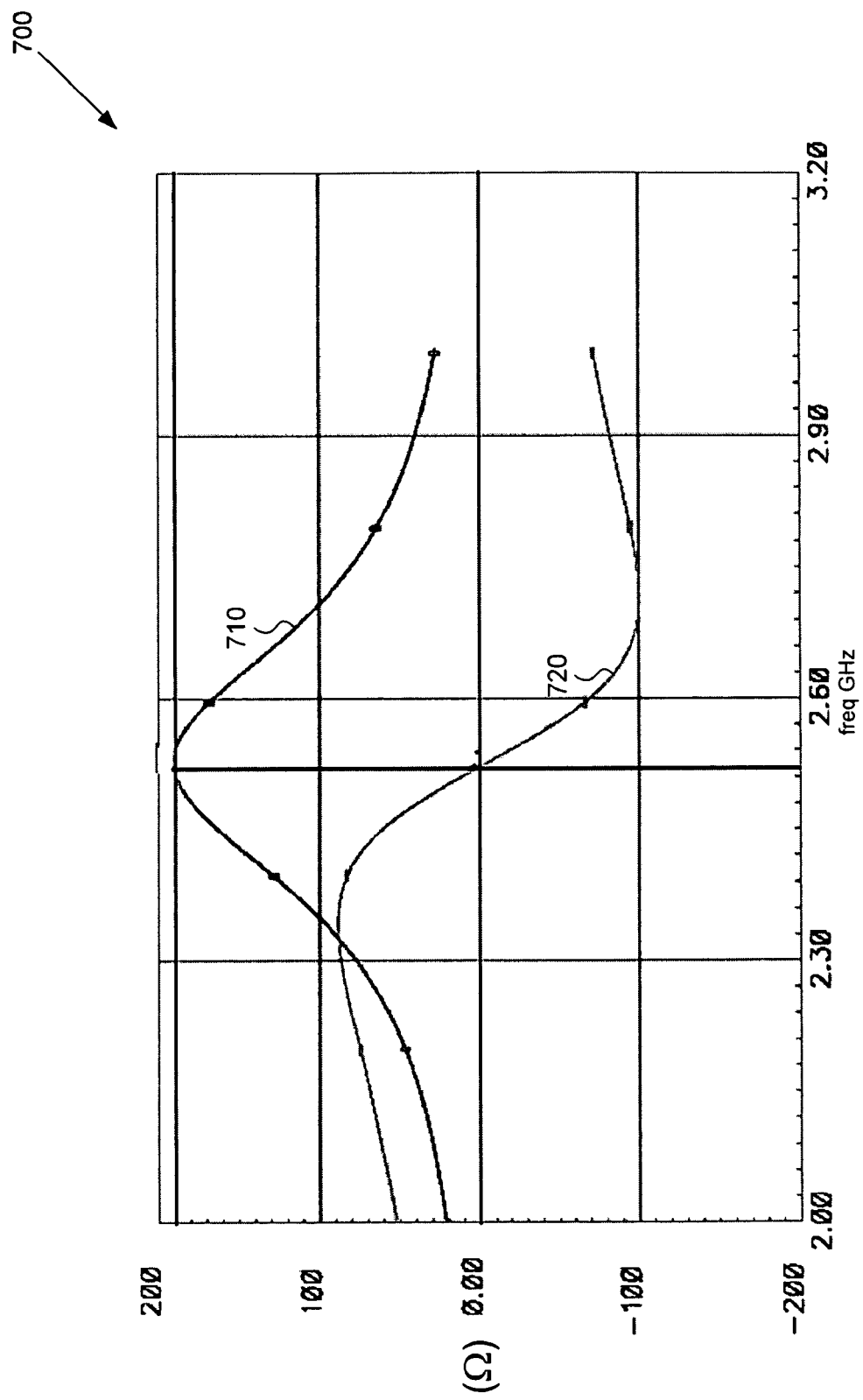

FIG. 7 shows an example plot of the load resistance and the load reactance of the PGA shown in FIG. 6 according to an embodiment of the present invention.

Figure 8:
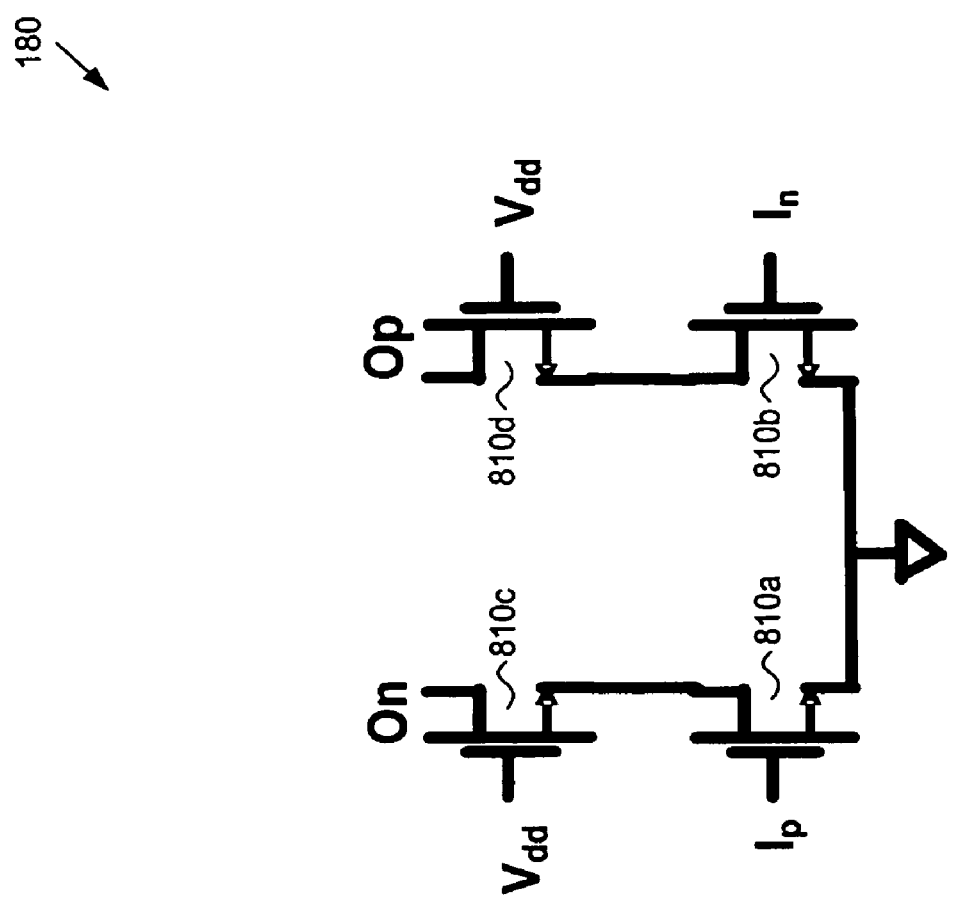

FIG. 8 is an example schematic of the PAD shown in FIG. 1 according to an embodiment of the present invention.

Figure 9:
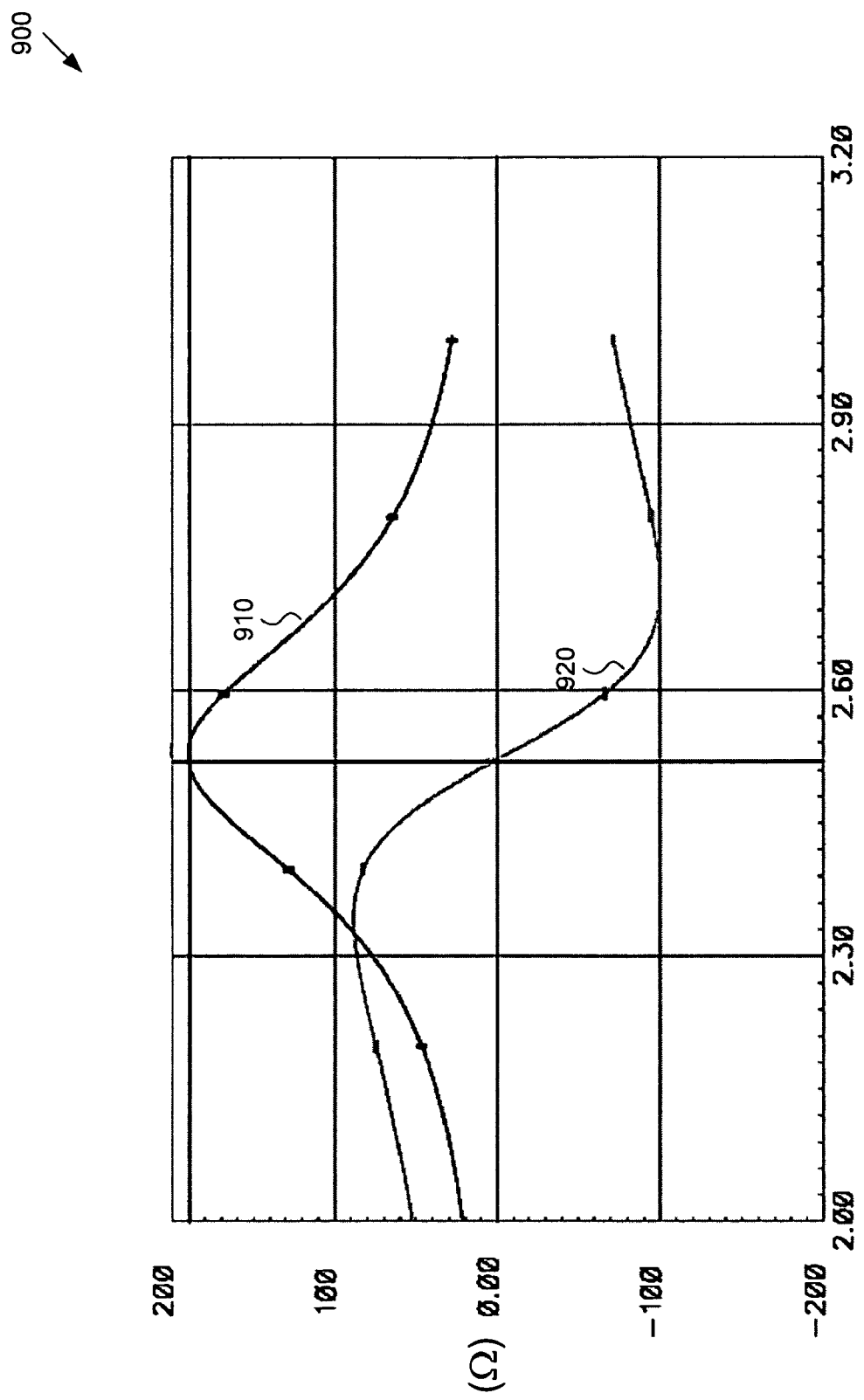

FIG. 9 shows an example plot of the load resistance and the load reactance of the PAD shown in FIG. 8 according to an embodiment of the present invention.

Figure 10:
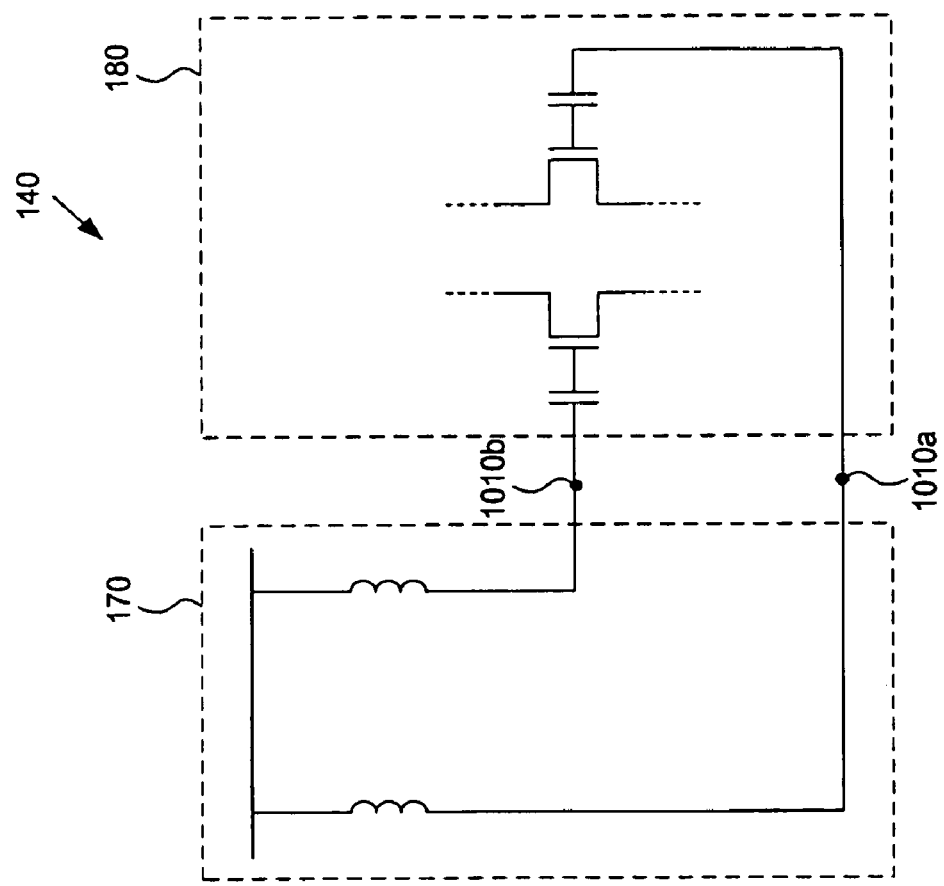

FIG. 10 is a simplified schematic of the amplifier block shown in FIG. 1 including the PGA and the PAD according to an embodiment of the present invention.

Figure 10A:
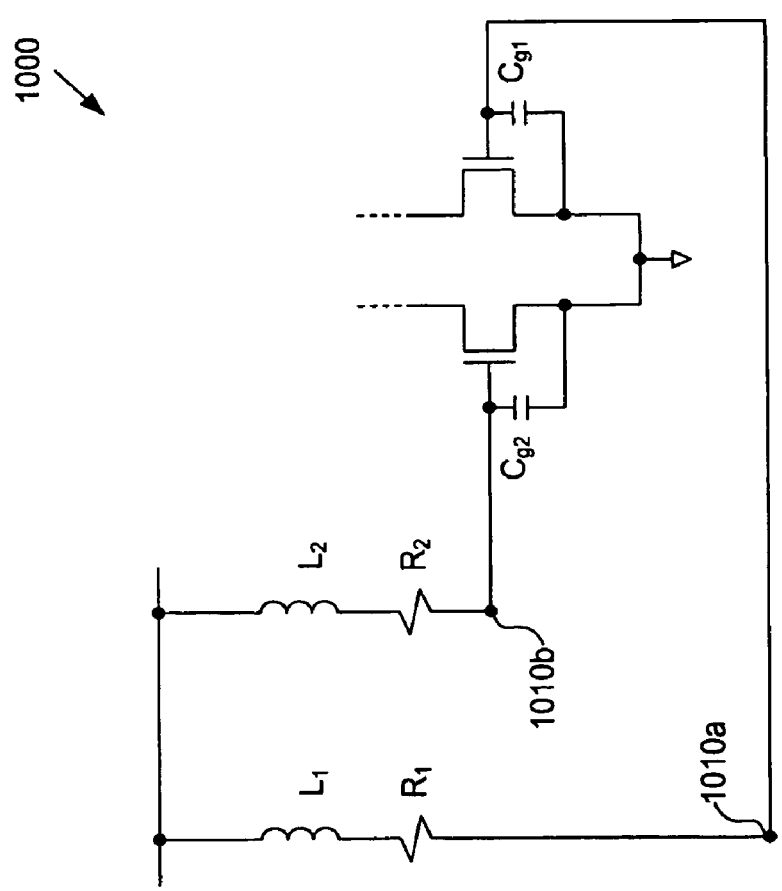

FIG. 10A is an equivalent circuit of the simplified schematic shown in FIG. 10 according to an embodiment of the present invention.

Figure 11:
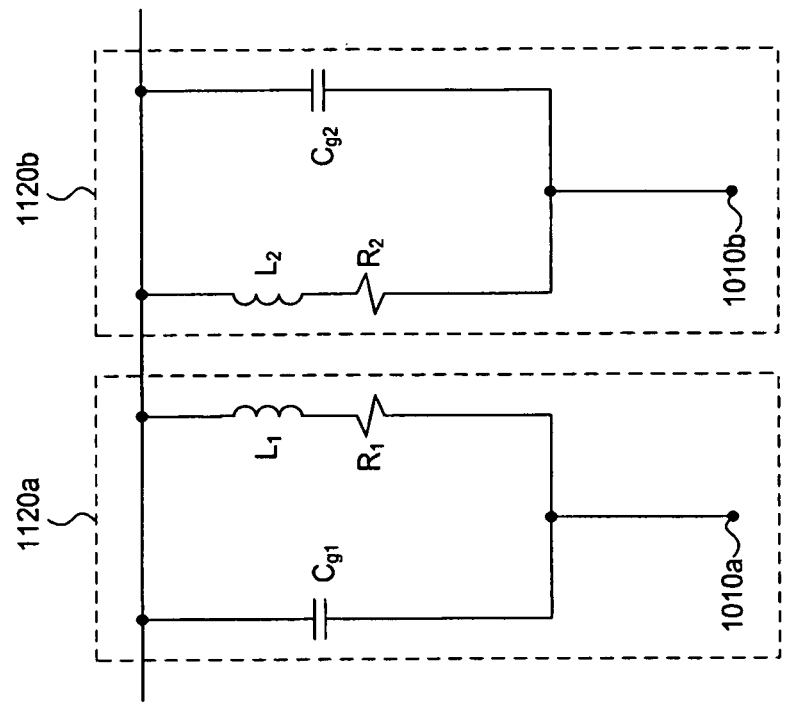

FIG. 11 is a simplified version of the equivalent circuit shown in FIG. 10 according to an embodiment of the present invention.

Figure 12:
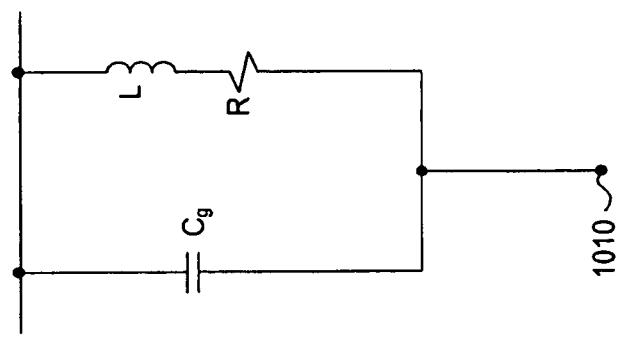

FIG. 12 is an equivalent circuit that combines differential portions of the equivalent circuit shown in FIG. 11 according to an embodiment of the present invention.

Figure 13:
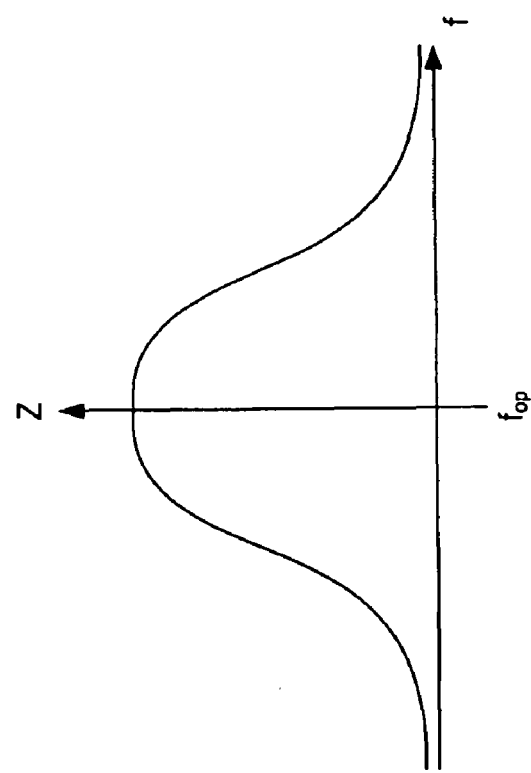

FIG. 13 is a graphical representation of the magnitude of the impedance at the output of PGA shown in FIG. 6 with respect to frequency according to an embodiment of the present invention.

Figure 14:
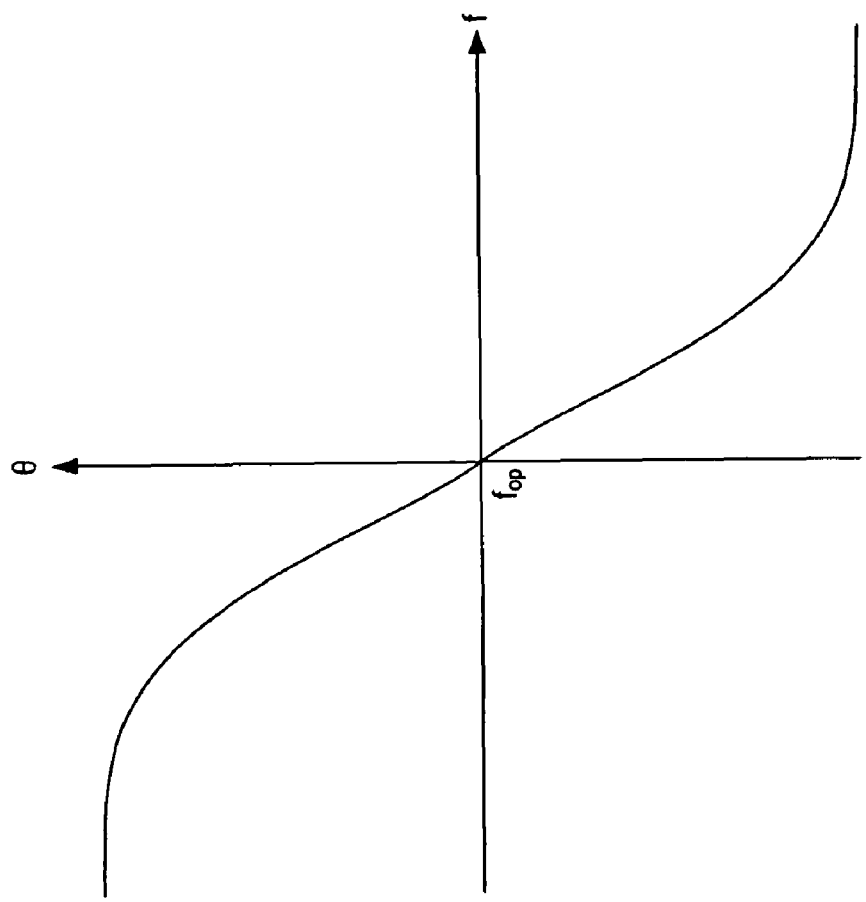

FIG. 14 is a graphical representation of the phase of the impedance at the output of the PGA shown in FIG. 6 with respect to frequency according to an embodiment of the present invention.

Figure 15:
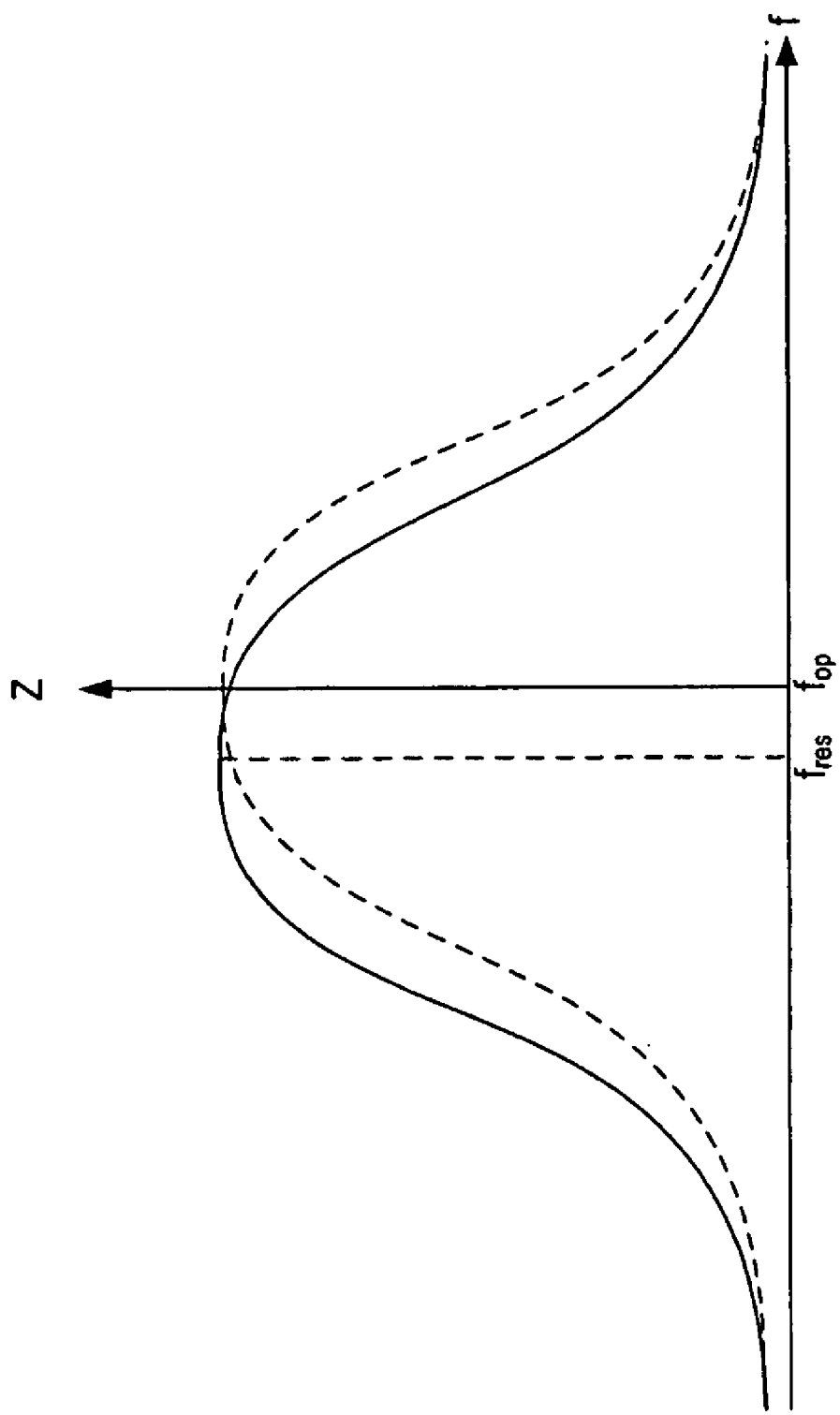

FIG. 15 is a graphical representation of the magnitude response at the output of the PGA shown in FIG. 6, where the resonant frequency $f_{res}$ of the equivalent circuit shown in FIG. 12 is less than the operating frequency $f_{op}$ of the PGA according to an embodiment of the present invention.

Figure 16:
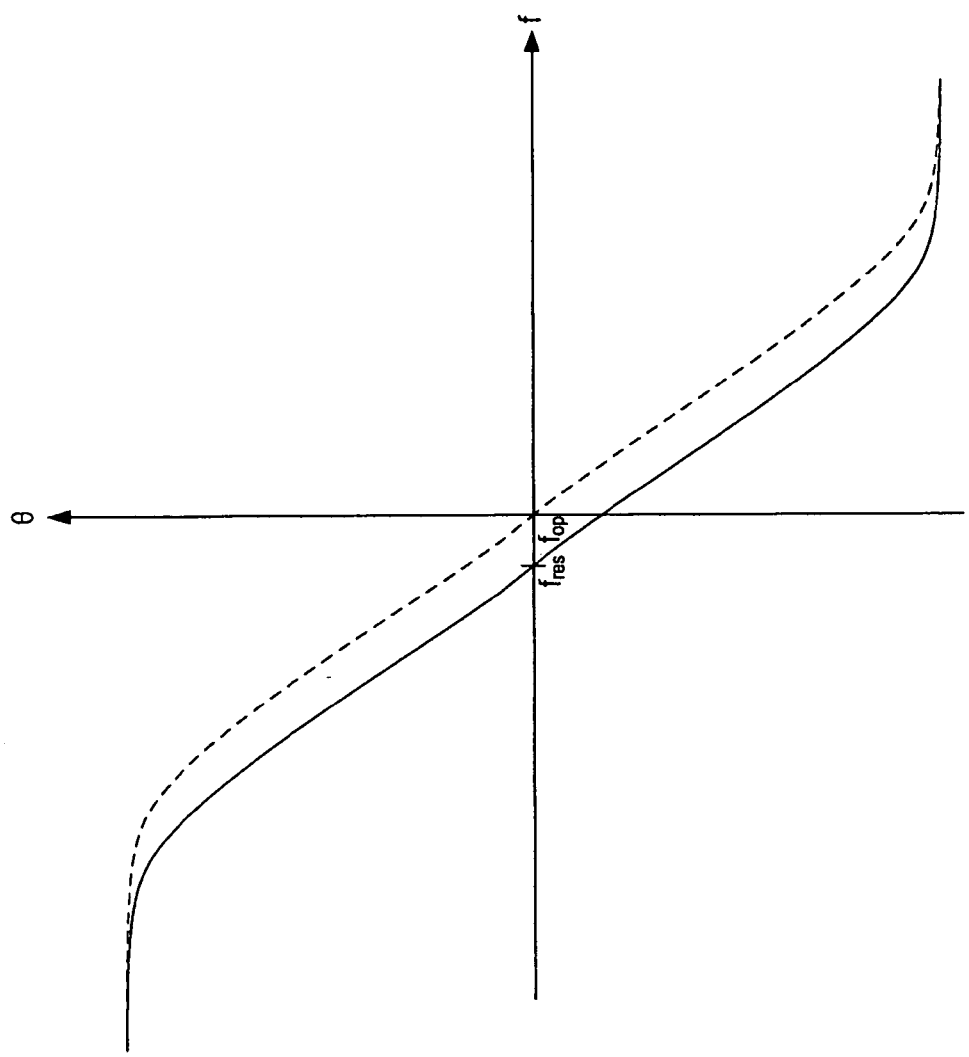

FIG. 16 is a graphical representation of the phase response at the output of the PGA shown in FIG. 6, where the resonant frequency $f_{res}$ of the equivalent circuit shown in FIG. 12 is less than the operating frequency $f_{op}$ of the PGA according to an embodiment of the present invention.

Figure 17:
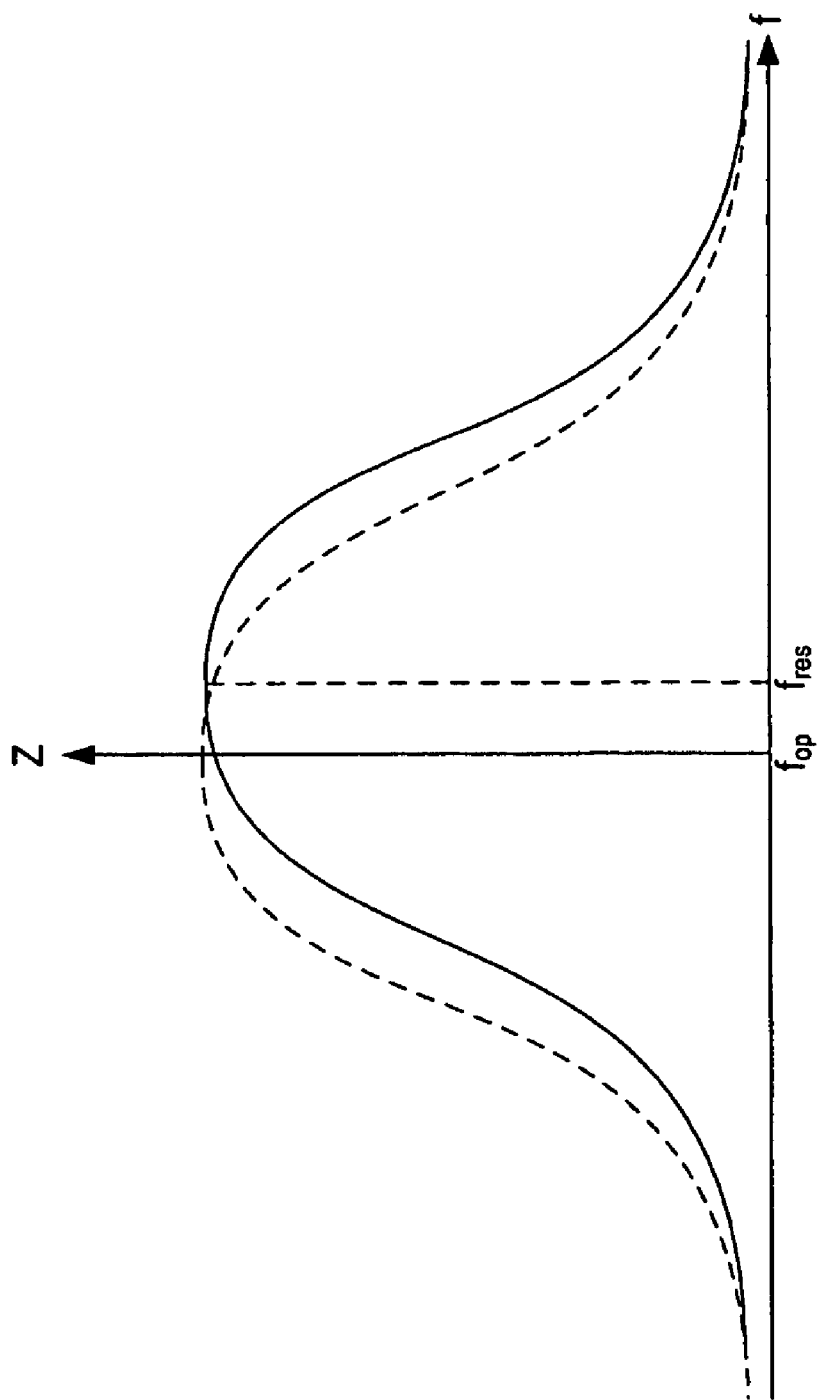

FIG. 17 is a graphical representation of the magnitude response at the output of the PGA shown in FIG. 6, where the resonant frequency $f_{res}$ of the equivalent circuit shown in FIG. 12 is greater than the operating frequency $f_{op}$ of the PGA according to an embodiment of the present invention.

Figure 18:
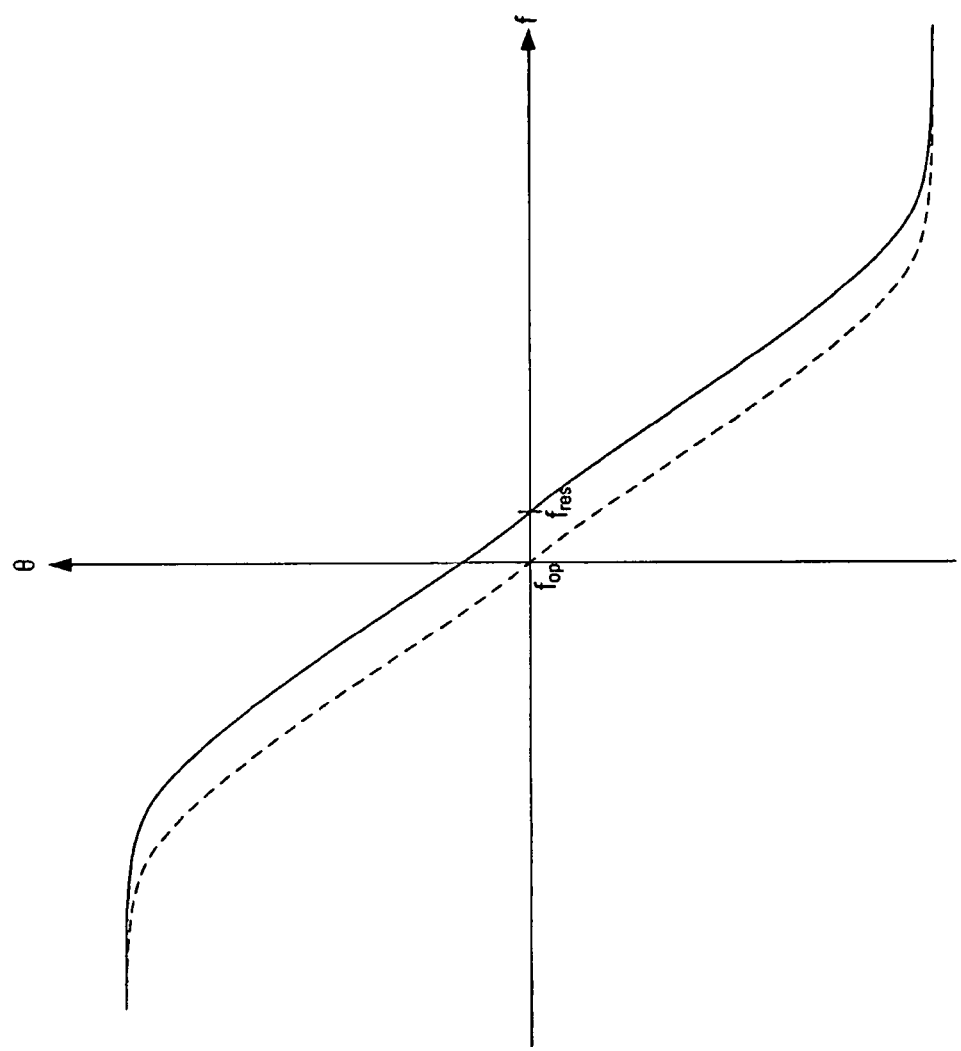

FIG. 18 is a graphical representation of the phase response at the output of the PGA shown in FIG. 6, where the resonant frequency $f_{res}$ of the equivalent circuit shown in FIG. 12 is greater than the operating frequency $f_{op}$ of the PGA according to an embodiment of the present invention.

Figure 19A:
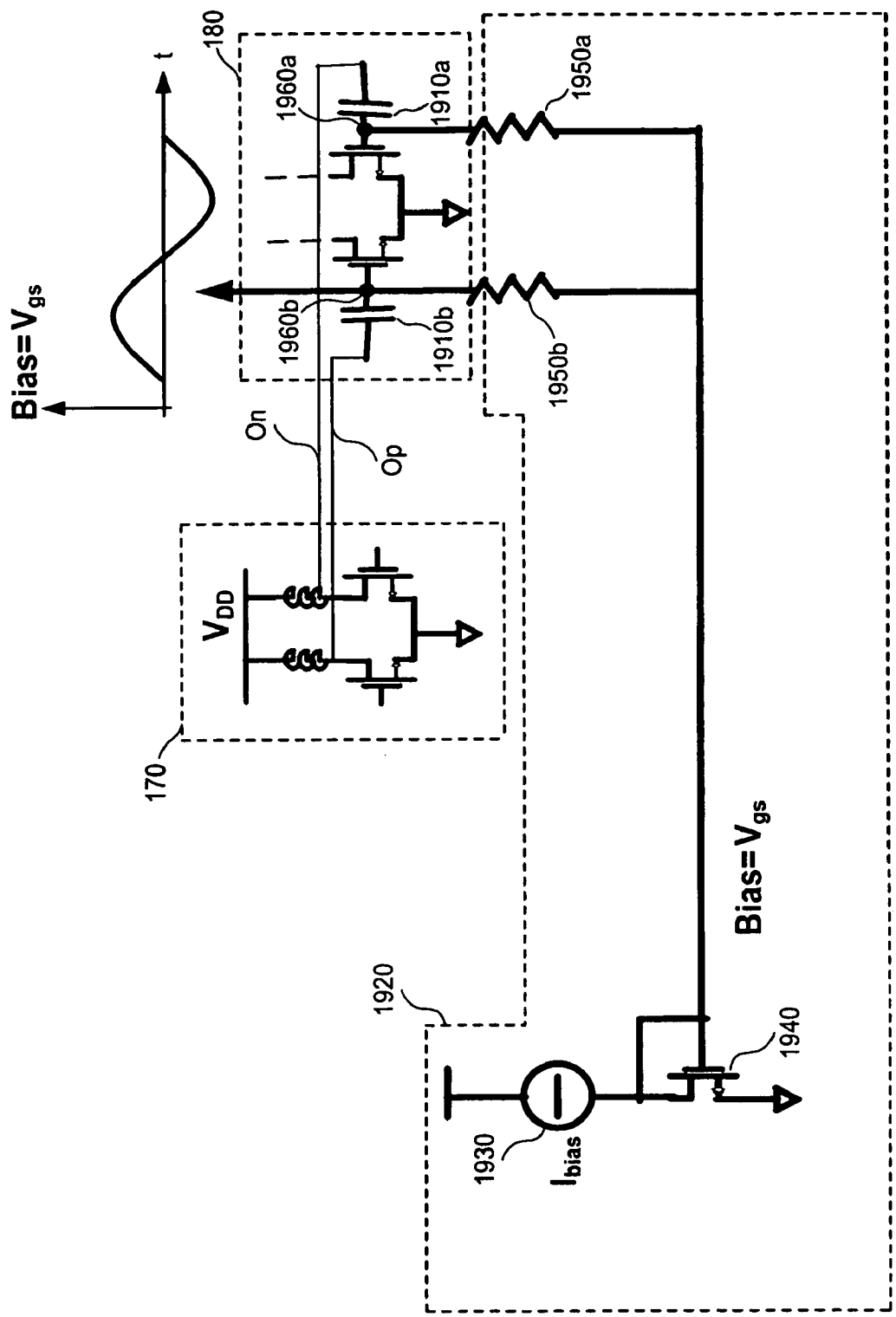

FIG. 19A shows an example biasing configuration of the PAD shown in FIG. 8 according to an embodiment of the present invention.

Figure 19B:
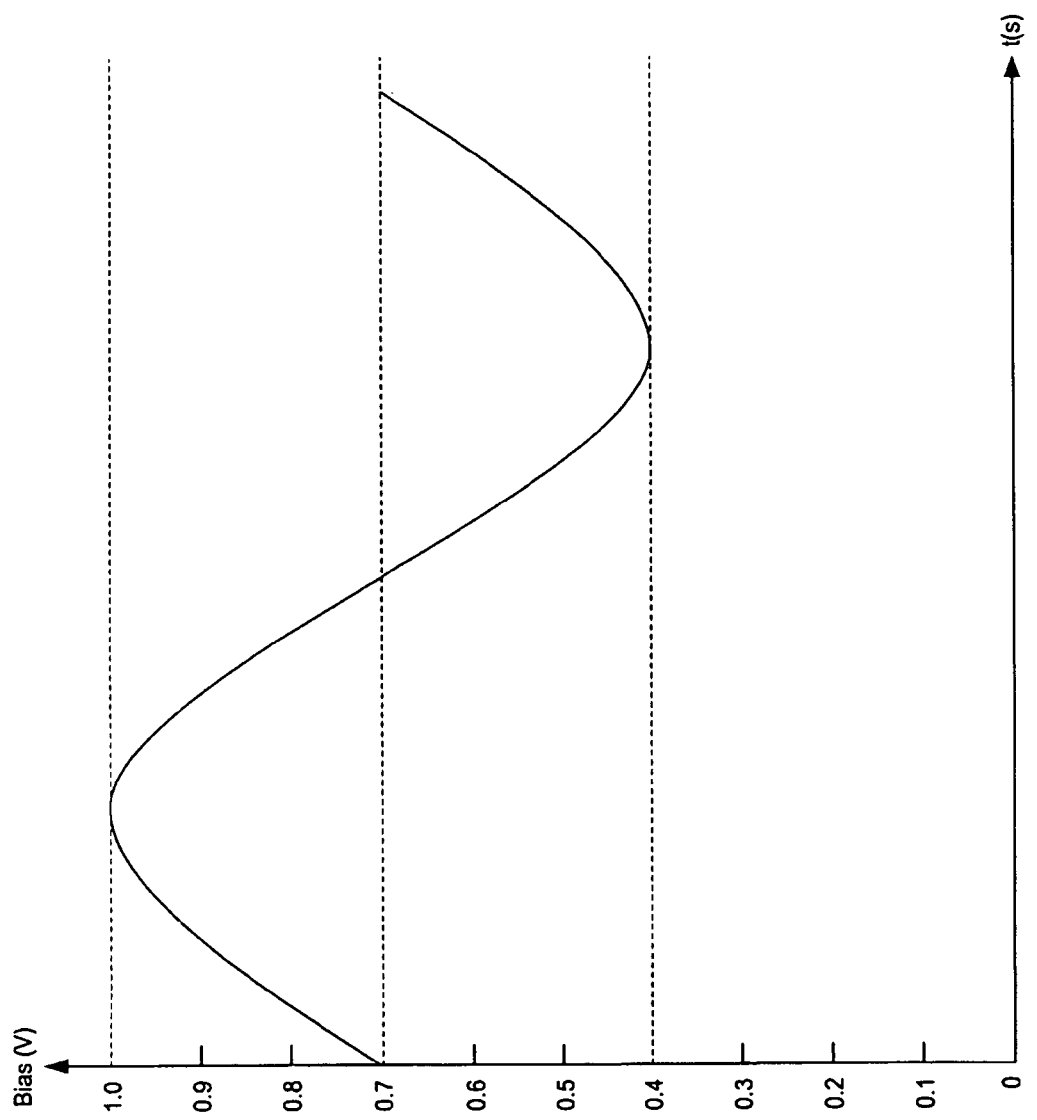

FIG. 19B is a graphical representation of a bias applied to input terminals of the PAD with respect to time according to an embodiment of the present invention.

Figure 19C:
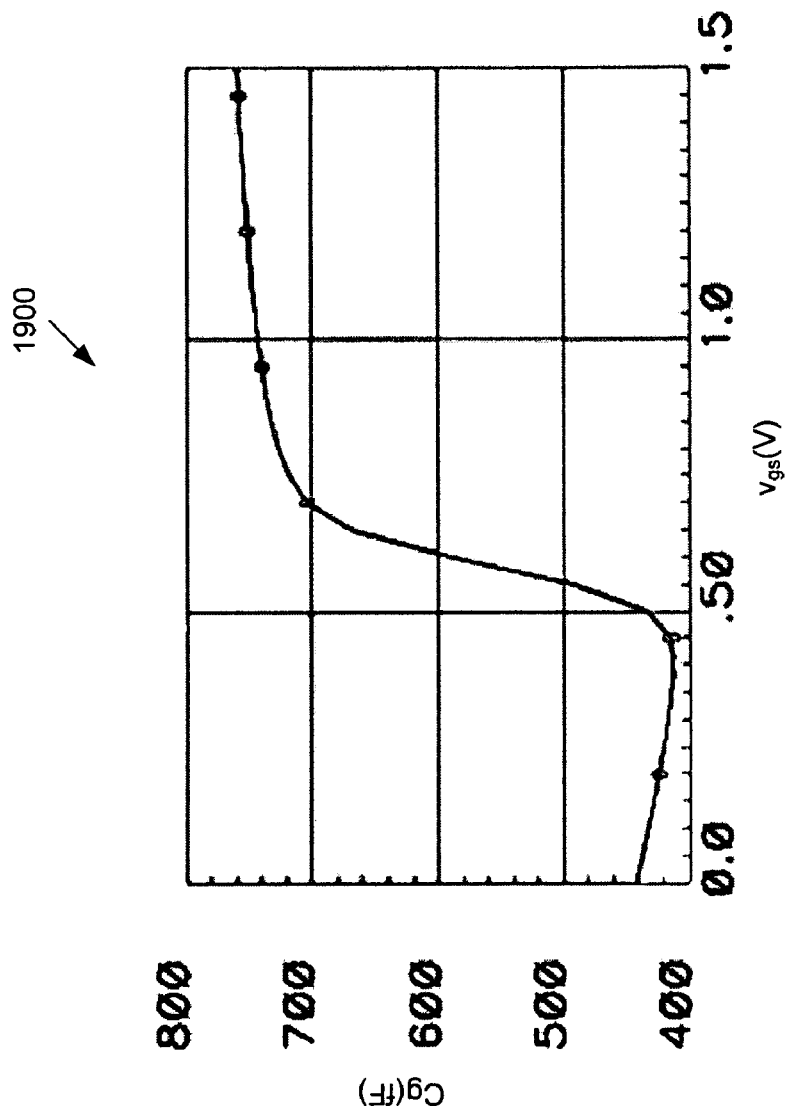

FIG. 19C shows an example plot of a relationship between the input capacitance $C_g$ of the PAD shown in FIG. 8 and the gate-to-source voltage $(v_{gs})$ of the PAD according to an embodiment of the present invention.

Figure 20:
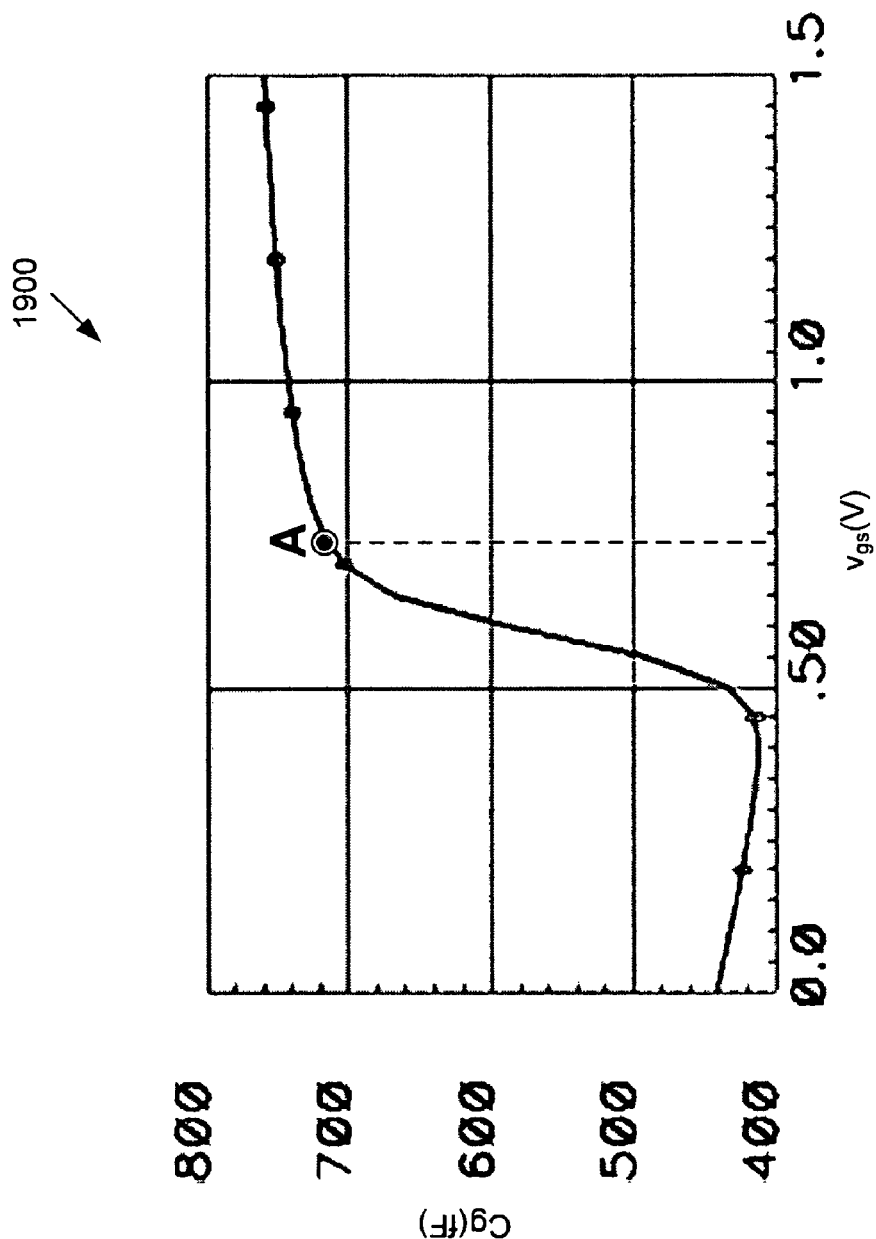

FIG. 20 illustrates an example biasing point A of the PAD shown in FIG. 8 according to an embodiment of the present invention.

Figure 21:
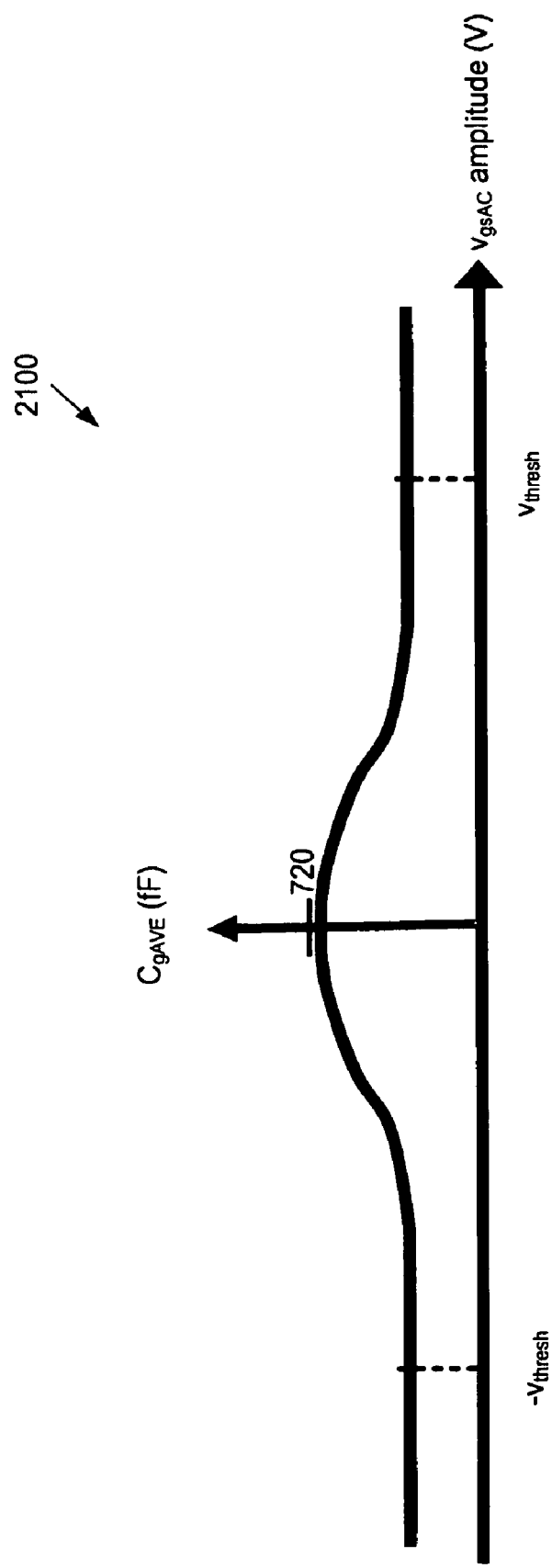

FIG. 21 is a plot of the average input capacitance $C_{gAVE}$ of the PAD shown in FIG. 8 being biased at point A in FIG. 19C according to an embodiment of the present invention.

Figure 22:
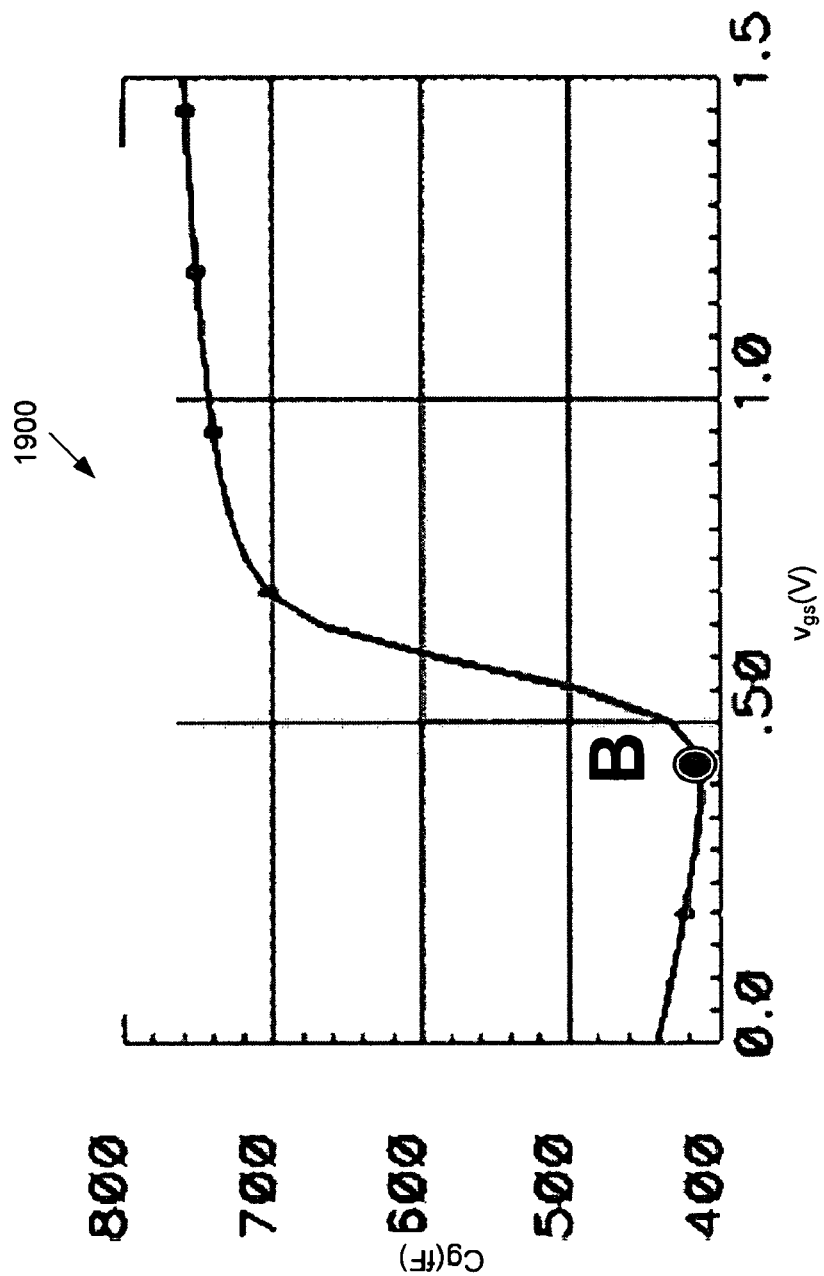

FIG. 22 illustrates an example biasing point B of the PAD shown in FIG. 8 according to an embodiment of the present invention.

Figure 23:
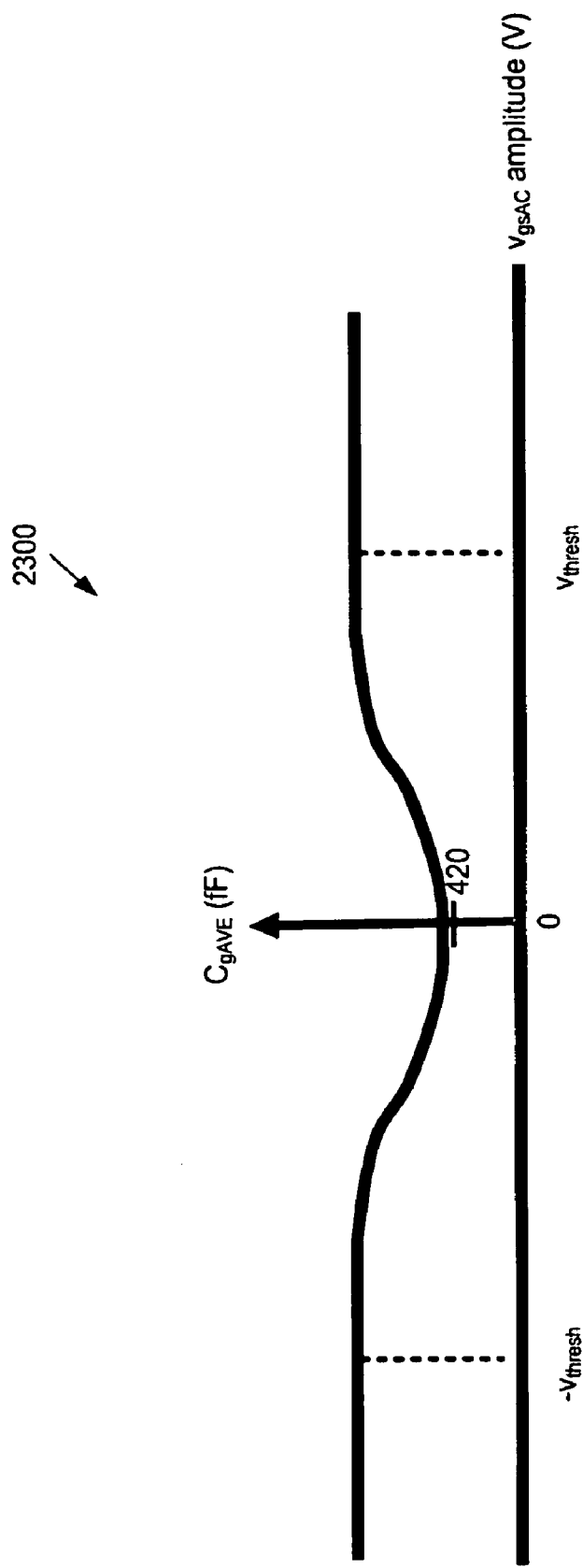

FIG. 23 is a plot of the average input capacitance $C_{gAVE}$ of the PAD shown in FIG. 8 being biased at point B in FIG. 19C according to an embodiment of the present invention.

Figure 24:
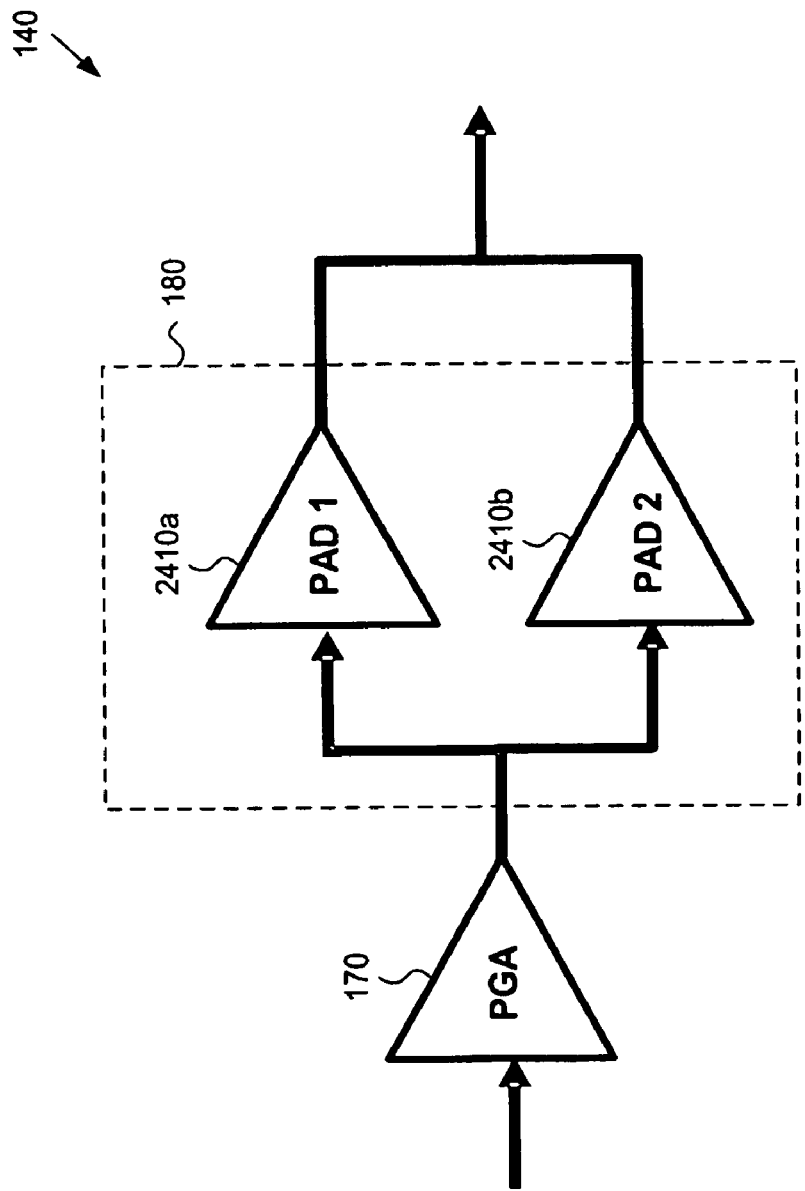

FIG. 24 illustrates the amplifier block in FIG. 1 having two PADs according to an embodiment of the present invention.

Figure 25:
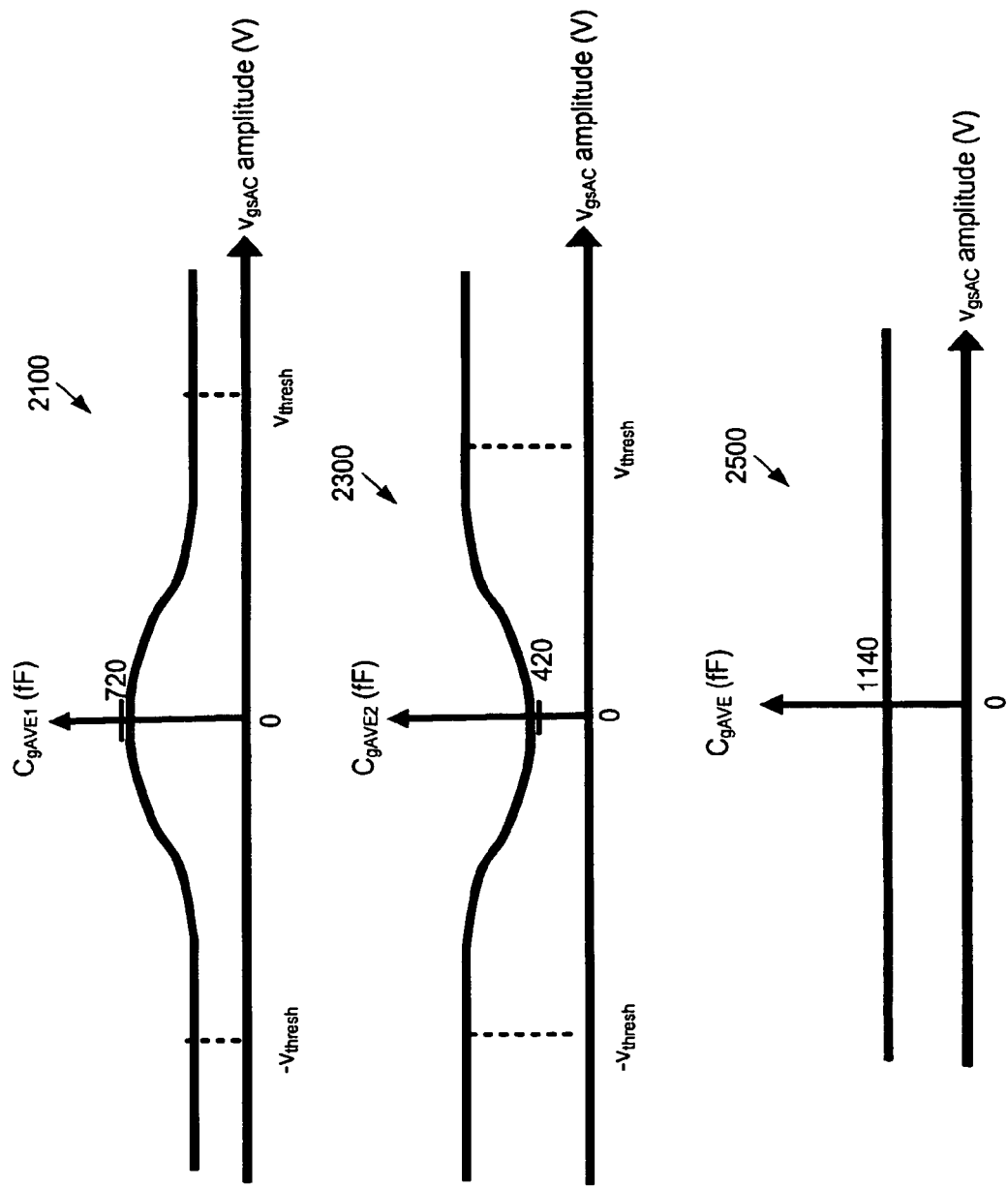

FIG. 25 shows a plot of the average input capacitance $C_{gAVE}$ of a PAD having the two PADs shown in FIG. 24 according to an embodiment of the present invention.

Figure 26:
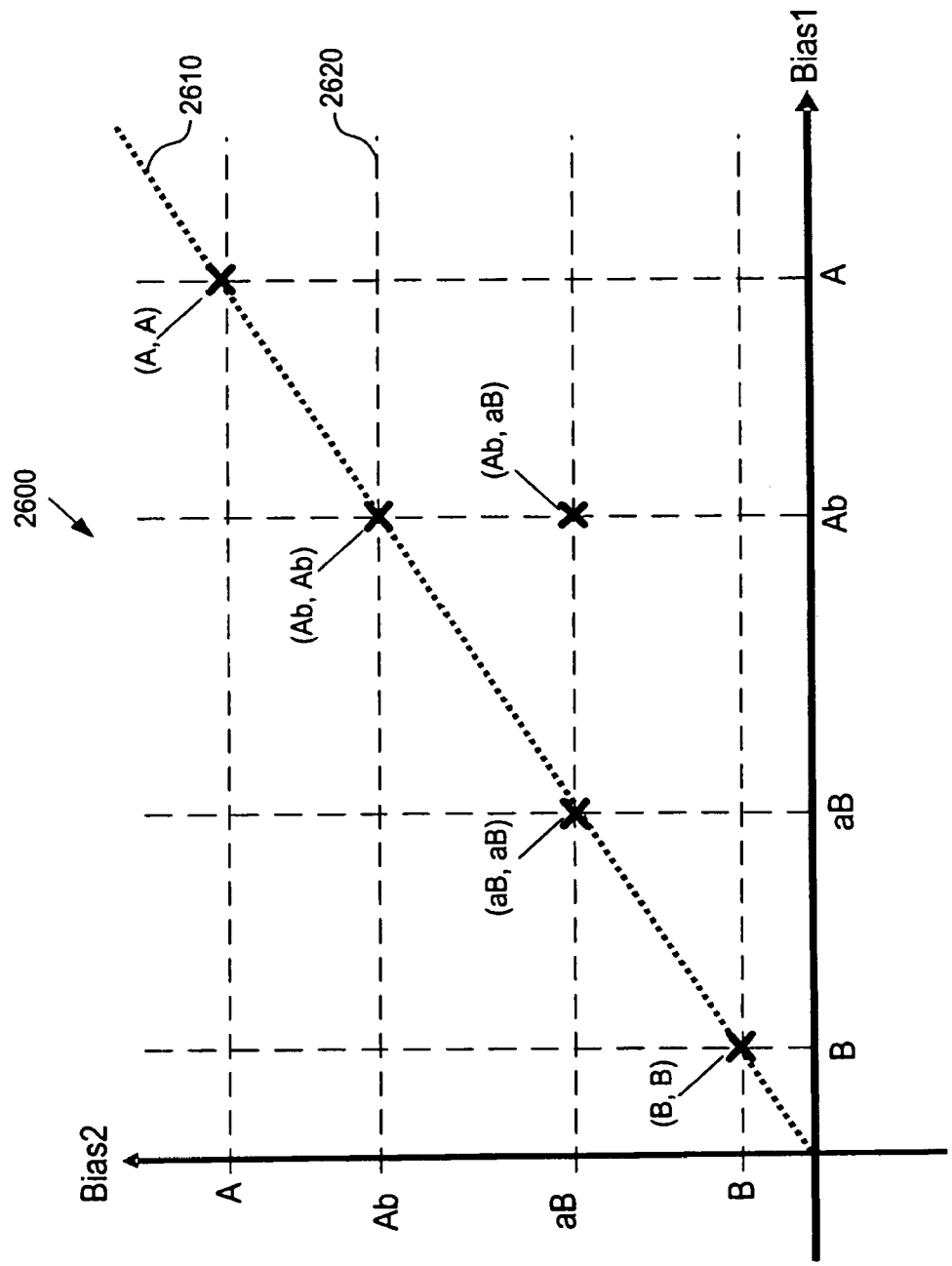

FIG. 26 illustrates biasing values available for a transmitter utilizing multiple PADs as compared to biasing values available for a traditional transmitter utilizing a single PAD according to an embodiment of the present invention.

Figure 27:
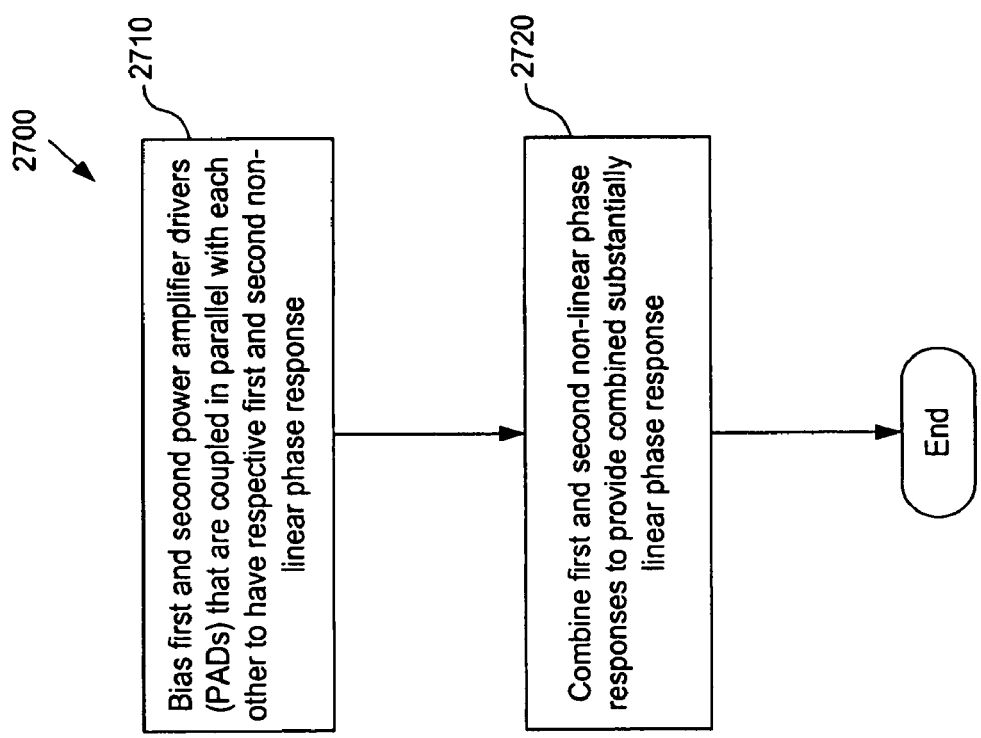

FIG. 27 is a flowchart of a method of providing a substantially linear phase response according to an embodiment of the present invention.

DETAILED DESCRIPTION OF THE INVENTION

Although the embodiments of the invention described herein refer specifically, and by way of example, to wireless transmitters, including those designed to be compatible with any one or more of the Institute of Electrical and Electronics Engineers (IEEE) 802.11 wireless local area network (LAN) standards, the IEEE 802.15 wireless personal area network (WPAN) standards, the IEEE 802.16 metropolitan area network (MAN) standards, or the Bluetooth® standard, it will be readily apparent to persons skilled in the relevant art(s) that embodiments of the invention are equally applicable to non-wireless transmitters.

1.0 OVERVIEW

FIG. 1 is a block diagram of an example transmitter 100 according to an embodiment of the present invention. Transmitter 100 includes low-pass filters (LPFs) 110a-b, transconductance blocks 120a-b, up-converters 130a-b, amplifier block 140, balun 150, and antenna 160. In FIG. 1, two differential signals are received at low-pass filters 110a-b. The differential signals are the in-phase component (I) and the quadrature component (Q) of the baseband signals. The in-phase and quadrature components can include unwanted adjacent channel energy. Low pass filters 110a-b eliminate or reduce the unwanted energy. Transconductance blocks 120a-b convert the filtered in-phase and quadrature components from voltages to currents.

The in-phase component passes through low-pass filter 110a and transconductance block 120a before being up-converted at up-converter 130a to provide a first RF component. Up-converter 130a mixes the converted in-phase component and a local oscillator signal to generate the first radio frequency (RF) component. The quadrature component passes through low-pass filter 110b and transconductance block 120b before being up-converted at up-converter 130b to provide a second RF component. Up-converter 130b mixes the converted quadrature component and the local oscillator signal to generate the second RF component. The first and second RF components are combined to form the differential modulated RF signal, which is provided to amplifier block 140.

Amplifier block 140 includes programmable gain amplifier (PGA) 170 and power amplifier driver (PAD) 180. The combined RF signal received by PGA 170 has a center frequency, which is referred to as the operating frequency $f_{op}$ of PGA 170 or PAD 180. PGA 170 amplifies the combined RF signal to provide sufficient signal strength to drive PAD 180. PAD 180 amplifies the signal received from PGA 170 to provide sufficient signal strength to drive balun 150. PGA 170 and PAD 180 are configured to charge and discharge respective gate-to-source capacitances quickly enough to provide sufficient power at frequencies near the upper threshold of a passband, for example. Balun 150 converts the differential signal received from PAD 180 to a single-ended signal, which is transmitted by antenna 160.

The single-ended signal transmitted by antenna 160 can be represented by the equation $v_{out}=V[\cos(\omega t+\phi+\phi_2)]$. V is the amplitude/magnitude of the single-ended signal. $\omega$ is the angular frequency of the single-ended signal, where $\omega=2\pi f$. f is the carrier frequency of the single-ended signal, which is based on the channel via which the single-ended signal travels. $\phi$ is the phase of the single-ended signal. $\phi_2$ is the fixed phase offset introduced by analog processing. $\phi_2$ is the same for all constellation points (described below with reference to FIGS. 2-5) and is hereinafter set to zero to facilitate the following discussion. However, persons skilled in the art will recognize that $\phi_2$ may be non-zero.

The magnitude V and the phase $\phi$ of the single-ended signal correspond to the in-phase (I) and quadrature (Q) components of the baseband signals. The magnitude V can be represented by the equation $V=\sqrt{I^2+Q^2}$. The phase $\phi$ can be represented by the equation $$\phi = \arctan\left(\frac{Q}{I}\right).$$

The baseband signals corresponding to I and Q can include multiple pairs of in-phase and quadrature components, depending on what type of modulation, if any, is used to modulate the differential signals. Each pair of in-phase and quadrature components corresponds to the single-ended signal transmitted at the antenna 160 having a respective magnitude V and a respective phase $\phi$. The different magnitudes V and associated phases $\phi$ may be mapped using a constellation, such as constellation 200, described below with respect to FIGS. 2-5.

FIG. 2 illustrates a constellation 200 showing a relationship between in-phase (I) and quadrature (Q) components that have been modulated in accordance with a sixteen quadrature amplitude modulation (16 QAM) technique according to an embodiment of the present invention. Constellation 200 includes sixteen points (X), each corresponding to a different pair of in-phase and quadrature components (I,Q). Each pair of in-phase and quadrature components is generated by a different quadrature amplitude modulator (QAM). Transmitter 100 can include any suitable type and/or number of modulators.

Each point in constellation 200 represents a bit combination. The number of bits in a bit combination can be determined by the equation $Y=2^x$. X is the number of bits in the bit combination, and Y is the corresponding number of points in constellation 200. In the embodiment of FIG. 2, the number of points in constellation 200 is sixteen, and each point provides information corresponding to a combination of four bits. FIG. 2A provides an example table showing the relationship between bit combinations and points in constellation 200 according to an embodiment of the present invention.

The single-ended signal transmitted by antenna 160 includes signal portions, each of which corresponds to a bit combination. For example, if transmitter 100 transmits a single-ended signal that includes information corresponding to bit combinations 0000, 1101, and 0011, the single-ended signal includes a first signal portion having a magnitude V and phase $\phi$ corresponding to constellation point 210a, a second signal portion having a magnitude V and phase $\phi$ corresponding to constellation point 210n, and a third signal portion having a magnitude V and phase $\phi$ corresponding to constellation point 210d. Each signal portion is transmitted for a period of time that is based on the operating frequency $f_{op}$ of PAD 180. Consecutive signal portions may have different magnitudes V and/or phases $\phi$.

Referring back to FIG. 2, a constellation, such as constellation 200, can be used to determine whether the magnitude response and/or the phase response of transmitter 100 are distorted. A distortion occurs when an operating point (X) varies from its desired location in the constellation.

Referring to FIG. 2, point 210f in constellation 200 corresponds to an in-phase component and a quadrature component each having a magnitude of one. Point 210f has a magnitude of $\sqrt{1^2+1^2}=\sqrt{2}$ and a phase of $\tan^{-1}(1)=45°$. Point 210a corresponds to an in-phase component and a quadrature component each having a magnitude of three. Point 210a has a magnitude of $\sqrt{3^2+3^2}=3\sqrt{2}$ and a phase of $\tan^{-1}(1)=45°$. Because transmitter 100 is configured such that the ratio of the magnitude of point 210a to the magnitude of point 210f is 3:1, a ratio other than 3:1 indicates that transmitter 100 has a non-linear magnitude response (i.e., magnitude distortion). In FIG. 3, the magnitude of point 210a is greater than $3\sqrt{2}$, while the magnitude of point 210f remains $\sqrt{2}$. Thus, the ratio of the magnitude of point 210a to the magnitude of point 210f is greater than 3:1, indicating magnitude distortion.

FIG. 4 illustrates that magnitude distortion can be indicated by a ratio of less than that for which transmitter 100 is configured. In FIG. 4, point 210a is shifted in constellation 200 such that the magnitude of point 210a is less than $3\sqrt{2}$, while the magnitude of point 210f remains $\sqrt{2}$. Thus, the ratio of the magnitude of point 210a to the magnitude of point 210f is less than 3:1, indicating magnitude distortion. In fact, the magnitude distortion in FIG. 4 is so great that point 210a almost overlays point 210f. The magnitude distortion illustrated in FIG. 4 is greater than the magnitude distortion illustrated in FIG. 3 because the variation from the 3:1 ratio is greater in FIG. 4, as compared to the variation shown in FIG. 3.

Points in constellation 200 may be in such close proximity that a receiver is unable to distinguish the points. For instance, in FIG. 4, magnitude distortion of transmitter 100 causes points 210f and 210a to be in close proximity. Referring to FIG. 4, a receiver may not be capable of distinguishing whether in-phase and quadrature RF components associated with point 210f were transmitted or in-phase and quadrature RF components associated with point 210a were transmitted.

FIG. 5 shows that phase distortion of transmitter 100 can cause points of constellation 200 to be indistinguishable. In FIG. 5, the phase of point 210a varies such that point 210a is in close proximity with point 210b. Referring to FIG. 5, a receiver may not be capable of distinguishing whether in-phase and quadrature RF components associated with point 210a are being received or in-phase and quadrature RF components associated with point 210b are being received.

Magnitude distortion and/or phase distortion can be caused by variations in the output impedance of PGA 170 or the input impedance of PAD 180. For example, a change of the output inductance L of PGA 170 can cause a change in the magnitude and/or phase of a constellation point (X). In another example, signal swings at an output of PGA 170 can cause the input capacitance $C_g$ of PAD 180 to vary, thereby shifting one or more points (X) in constellation 200. Different points (X) in constellation 200 can have different magnitude variations and/or different phase variations. Different points (X) can be associated with different input capacitances $C_g$ of PAD 180. Thus, different constellation points (X) can correspond to different loads of PGA 170. A more detailed analysis of PGA 170 and PAD 180 may shed more light on how to improve the magnitude response and/or the phase response of transmitter 100.

2.0 EXAMPLE PGA/PAD SCHEMATICS

FIG. 6 is an example schematic of PGA 170 according to an embodiment of the present invention. PGA 170 includes transistors 610a-d. In FIG. 6, each transistor has a source, a drain, and a gate. A source of transistor 610c is coupled to a drain of transistor 610a. A source of transistor 610d is coupled to a drain of transistor 610b. A source of transistor 610a and a source of transistor 610b are coupled to a ground potential. Gates of transistors 610a and 610b receive the differential modulated RF signal at outputs of up-converters 130a and 130b. Gates of transistors 610c and 610d are coupled to a supply voltage, $V_{dd}$. Drains of transistors 610c-d form a differential output. Transistors 610a-b form a differential pair, and transistors 610c-d are referred to as cascode transistors.

Some example circuit parameters will now be provided for PGA 170 for illustrative purposes. The scope of the present invention is not limited to the circuit parameters provided. The circuit parameters will depend upon the configuration of PGA 170. According to an embodiment, PGA 170 is capable of providing a linear output based on an input voltage of up to 500 mV or more. PGA 170 can have an inductance of approximately 2 nH and a quality factor (Q) of approximately 8.5.

FIG. 7 shows an example plot 700 of the load resistance 710 and the load reactance 720 of PGA 170 according to an embodiment of the present invention. As shown in FIG. 7, PGA 170 can have a resistance of 180Ω and a reactance of 0Ω at approximately 2.5 GHz. In other words, the impedance of PGA 170 at 2.5 GHz can have substantially no imaginary component or a negligible imaginary component.

FIG. 8 is an example schematic of PAD 180 according to an embodiment of the present invention. PAD 180 is configured similarly to PGA 170, described above with respect to FIG. 6, though the scope of the present invention is not limited in this respect. Referring to FIG. 8, PAD 180 includes transistors 810a-d, each having a source, a drain, and a gate. A source of transistor 810c is coupled to a drain of transistor 810a. A source of transistor 810d is coupled to a drain of transistor 810b. A source of transistor 810a and a source of transistor 810b are coupled to a ground potential. A gate of transistor 810a is coupled to the drain of one of transistors 610c and 610d of PGA 170. A gate of transistor 810b is coupled to the drain of the other transistor 610d or 610c of PGA 170. Gates of transistors 810c and 810d are coupled to a supply voltage, $V_{dd}$. Drains of transistors 810c-d form a differential output. Transistors 810a-b form a differential pair, and transistors 810c-d are referred to as cascode transistors.

Below are some example circuit parameters for PAD 180. The scope of the present invention is not limited to the circuit parameters provided. The circuit parameters will depend upon the configuration of PAD 180. According to an embodiment, PAD 180 is capable of providing a linear output based on an input voltage of up to 15 dBm or more. The output of PAD 180 is substantially linear up to a compression point, above which an increase in the input voltage has less effect on the increase of output voltage. PAD 180 can have an inductance of approximately 1.8 nH and a quality factor (Q) of approximately seven or eight. FIG. 9 shows an example plot 900 of the load resistance 910 and the load reactance 920 of PAD 180 according to an embodiment of the present invention. As shown in FIG. 9, PAD 180 can have a load resistance of 200Ω and a load reactance of 0Ω at approximately 2.5 GHz. In other words, the load impedance of PAD 180 at 2.5 GHz can have substantially no imaginary component or a negligible imaginary component.

In FIGS. 6 and 8, transistors 610a-d and 810a-d are metal oxide semiconductor (MOS) transistors for illustrative purposes. Persons skilled in the art will recognize that transistors 610a-d and 810a-d can be any type of transistors and need not be the same type of transistors. Transistors 610a-d and 810a-d may be bipolar junction transistors (BJTs), junction field effect transistors (JFETs), heterojunction field effect transistors (HFETs), metal semiconductor field effect transistors (MESFETs), high electron mobility transistors (HEMTs), pseudomorphic high electron mobility transistors (PHEMTs), modulated doped field effect transistors (MODFETs), two-dimensional electron gas field effect transistors (TEGFETs), selectively doped heterojunction transistors (SDHTs), or complementary heterostructure field effect transistors (CHFETs), or any combination thereof, to provide some examples.

3.0 EXAMPLE EQUIVALENT CIRCUIT

An analysis of the magnitude response and/or the phase response of transmitter 100 may be facilitated by determining an impedance at the output of PGA 170, which is the same as the input of PAD 180. FIG. 10 is a simplified schematic of amplifier block 140, showing PGA 170 coupled to PAD 180 at terminals 1010a-b according to an embodiment of the present invention. According to the embodiment of FIG. 10, the inductors shown in FIG. 10 resonate out a capacitance associated with outputs On and Op of PGA 170. An equivalent circuit 1000 of amplifier block 140 is provided in FIG. 10A to facilitate a determination of the impedance at the output of PGA 170.

Referring to FIG. 10A, equivalent circuit 1000 includes inductors $L_1$ and $L_2$, resistors $R_1$ and $R_2$, and capacitors $C_{g1}$ and $C_{g2}$. Resistors $R_1$ and $R_2$ are parasitic resistors associated with respective inductors $L_1$ and $L_2$. Capacitors $C_{g1}$ and $C_{g2}$ represent the gate capacitances associated with respective differential inputs of PAD 180.

FIG. 11 is a simplified version of equivalent circuit 1000 of FIG. 10 according to an embodiment of the present invention. In FIG. 11, equivalent circuit 1100 includes differential portions 1120a-b associated with respective terminals 1010a-b. Equivalent circuit 1100 allows a determination of an impedance at each differential terminal 1010a-b of PGA 170. Because the embodiment of FIG. 11 is representative of a differential design, differential portions 1120a-b are the same, and each may be represented by equivalent circuit 1200, as shown in FIG. 12.

4.0 IMPEDANCE OF EXAMPLE EQUIVALENT CIRCUIT

Referring to FIG. 12, the impedance at the output of PGA 170 is determined with reference to terminal 1010. L represents the output inductance of PGA 170, and $C_g$ represents the input capacitance (also referred to as the gate capacitance) of PAD 180. R represents a parasitic resistance associated with the output inductance, L, of PGA 170. The impedance associated with $C_g$ is represented by the equation $$Z_C = \frac{1}{j2\pi f_{op} C_g},$$

where $f_{op}$ is the operating frequency of PAD 180. The impedance associated with L is represented by the equation $Z_L = j2\pi f_{op} L$, where $f_{op}$ is the operating frequency of PGA 170. In the embodiment of FIG. 12, PGA 170 and PAD 180 operate at the same frequency. Thus, the operating frequency will be referred to generally hereinafter using the variable $f_{op}$. According to an embodiment of the present invention, the operating frequency $f_{op}$ is approximately 2.4 GHz.

The impedance at the output of PGA 170 is represented by the equation $$Z_{1010} = (R + Z_L) \| Z_C = (R + j2\pi f_{op} L) \| \left( \frac{1}{j2\pi f_{op} C_g} \right) = Z \angle \theta,$$

where Z and θ are the magnitude and phase, respectively, of the impedance $Z_{1010}$ at terminal 1010.

FIG. 13 is a graphical representation of the magnitude Z of the impedance $Z_{1010}$ at the output of PGA 170 with respect to frequency according to an embodiment of the present invention. If the RLC network of equivalent circuit 1200 is optimally tuned at the operating frequency $f_{op}$ of PGA 170 and PAD 180, then the magnitude Z is greatest at the operating frequency $f_{op}$, as shown in FIG. 13. For instance, the input capacitance $C_g$ of PAD 180 and/or the output inductance L of PGA 170 can be adjusted to achieve the magnitude response illustrated in FIG. 13. In FIG. 13, the magnitude response at the output of PGA 170 is depicted as a Gaussian distribution, though the magnitude response can have any suitable shape.

FIG. 14 is a graphical representation of the phase θ of the impedance $Z_{1010}$ at each differential output of PGA 170 with respect to frequency according to an embodiment of the present invention. A phase θ greater than zero corresponds to an impedance that is more inductive than capacitive, and a phase θ less than zero corresponds to an impedance that is more capacitive than inductive. Referring to FIGS. 13 and 14, impedances at frequencies less than $f_{op}$ are more inductive, and impedances at frequencies greater than $f_{op}$ are more capacitive.

In the embodiment of FIG. 14, the phase θ is substantially inversely proportional to frequency (i.e., phase θ decreases with an increase of frequency, and vice versa) in a frequency range that includes the operating frequency $f_{op}$ of PGA 170 and PAD 180. The term "proportional" need not necessarily indicate a linear relationship. For example, proportional can mean a linear relationship or a non-linear relationship. Outside the frequency range that includes the operating frequency $f_{op}$ of PGA 170 and PAD 180, a change in frequency does not substantially effect the phase θ of the impedance $Z_{1010}$ at the output of PGA 170. If the RLC network of equivalent circuit 1200 is optimally tuned at the operating frequency $f_{op}$ of PGA 170 and PAD 180, then the phase θ is substantially zero at the operating frequency $f_{op}$, as shown in FIG. 14.

For example, PGA 170 and/or PAD 180 may be configured such that equivalent circuit 1200 has a resonant frequency $f_{res}$ that is equal to the operating frequency $f_{op}$ of PGA 170 and PAD 180, where the resonant frequency $f_{res}$ is represented by the equation $$f_{res} = \frac{1}{2\pi\sqrt{LC_t}} \approx \frac{1}{2\pi\sqrt{LC_g}}.$$

$C_t$ is the total capacitance at the output of PGA 170. As indicated by the preceding equation, the input capacitance $C_g$ of PAD 180 constitutes most of the total capacitance $C_t$ at the output of PGA 170. For illustrative purposes, the following discussion will assume that the total capacitance $C_t$ at the output of PGA 170 comes entirely from the input capacitance $C_g$ of PAD 180. However, persons skilled in the art will recognize that a difference between $C_t$ and $C_g$ may not be negligible.

In this example, equivalent circuit 1200 is considered to be optimally tuned when $$f_{op} = f_{res} = \frac{1}{2\pi\sqrt{LC_g}}.$$

A variation of the input capacitance $C_g$ of PAD 180 and/or the output inductance L of PGA 170 may vary the resonant frequency $f_{res}$ such that $f_{op} \neq f_{res}$.

FIGS. 15 and 16 are graphical representations of the magnitude response and the phase response, respectively, at the output of PGA 170, where the resonant frequency $f_{res}$ of equivalent circuit 1200 is less than the operating frequency $f_{op}$ of PGA 170 and PAD 180 according to embodiments of the present invention. Referring to FIGS. 15 and 16, the input capacitance $C_g$ of PAD 180 is greater than an optimal value, thereby decreasing the resonant frequency $f_{res}$ of equivalent circuit 1200. The magnitude and phase responses shown in respective FIGS. 15 and 16 are shifted lower in frequency as compared to the magnitude and phase responses shown in respective FIGS. 13 and 14.

In FIG. 15, the optimal magnitude response corresponding to equivalent circuit 1200 having a resonant frequency $f_{res}$ that is equal to the operating frequency $f_{op}$ of PGA 170 and PAD 180 is illustrated by the dashed curve. The magnitude response at the output of PGA 170 corresponding to equivalent circuit 1200 having $f_{res} < f_{op}$ of PGA 170 and PAD 180 is illustrated by the solid curve. As shown by the solid curve, the magnitude Z of the impedance $Z_{1010}$ at the output of PGA 170 is less than an optimal magnitude at the operating frequency $f_{op}$.

In FIG. 16, the optimal phase response corresponding to equivalent circuit 1200 having a resonant frequency $f_{res}$ that is equal to the operating frequency $f_{op}$ of PGA 170 and PAD 180 is illustrated by the dashed curve. The phase response at the output of PGA 170 corresponding to equivalent circuit 1200 having $f_{res} < f_{op}$ of PGA 170 and PAD 180 is illustrated by the solid curve. As shown by the solid curve, the phase θ of the impedance $Z_{1010}$ at the output of PGA 170 is less than the optimal phase of zero at the operating frequency $f_{op}$.

FIGS. 17 and 18 are graphical representations of the magnitude response and the phase response, respectively, at the output of PGA 170, where the resonant frequency $f_{res}$ of equivalent circuit 1200 is greater than the operating frequency $f_{op}$ of PGA 170 and PAD 180 according to embodiments of the present invention. Referring to FIGS. 17 and 18, the input capacitance $C_g$ of PAD 180 is less than an optimal value, thereby increasing the resonant frequency $f_{res}$ of equivalent circuit 1200. The magnitude and phase responses shown in respective FIGS. 17 and 18 are shifted higher in frequency as compared to the magnitude and phase responses shown in respective FIGS. 13 and 14.

In FIG. 17, the optimal magnitude response corresponding to equivalent circuit 1200 having a resonant frequency $f_{res}$ that is equal to the operating frequency $f_{op}$ of PGA 170 and PAD 180 is illustrated by the dashed curve. The magnitude response at the output of PGA 170 corresponding to equivalent circuit 1200 having $f_{res} > f_{op}$ of PGA 170 and PAD 180 is illustrated by the solid curve. As shown by the solid curve, the magnitude Z of the impedance $Z_{1010}$ at the output of PGA 170 is less than an optimal magnitude at the operating frequency $f_{op}$.

In FIG. 18, the optimal phase response corresponding to equivalent circuit 1200 having a resonant frequency $f_{res}$ that is equal to the operating frequency $f_{op}$ of PGA 170 and PAD 180 is illustrated by the dashed curve. The phase response at the output of PGA 170 corresponding to equivalent circuit 1200 having $f_{res} > f_{op}$ of PGA 170 and PAD 180 is illustrated by the solid curve. As shown by the solid curve, the phase θ of the impedance $Z_{1010}$ at the output of PGA 170 is greater than the optimal phase of zero at the operating frequency $f_{op}$.

The input capacitance $C_g$ of PAD 180 may be based on a bias of PAD 180. According to an embodiment, the bias is provided by a voltage source. The bias may be controlled using digital circuitry, analog circuitry, software, firmware, or any combination thereof. In another embodiment, the bias is changed by the output swing of PGA 170. Varying the bias varies the input capacitance $C_g$ of PAD 180, thereby varying the resonant frequency $f_{res}$ of equivalent circuit 1200.

FIG. 19A shows an example biasing configuration of PAD 180 according to an embodiment of the present invention. In FIG. 19A, AC coupling is provided to PAD 180 by connecting outputs On and Op of PGA 170 to input terminals 1960a-b of PAD 180. PAD 180 includes DC blocking capacitors 1910a-b to block respective DC components of outputs On and Op. According to an embodiment, DC blocking capacitors 1910a-b are included in PAD 180, as shown in FIG. 19A. In another embodiment, DC blocking capacitors 1910a-b are external to PAD 180.

Referring to FIG. 19A, DC bias is provided to PAD 180 using DC bias block 1920. DC bias block 1920 includes a current source 1930, a transistor 1940 and resistors 1950a-b. Transistor 1940 is a FET transistor for illustrative purposes, though transistor 1940 may be any type of transistor. Transistor 1940 includes a drain, a gate, and a source. Transistor 1940 is diode coupled, meaning that the drain of transistor 1940 is coupled to the gate of transistor 1940. Current source 1930 provides a DC current to the drain of transistor 1940. The DC current flows across resistors 1950a-b to provide a DC bias to PAD 180. DC bias block 1920 is configured to provide the same DC bias to each input terminal 1960a-b of PAD 180. For example, resistors 1950a-b are configured to have the same resistance as each other.

FIG. 19B is a graphical representation of a bias applied to input terminals 1960a-b of PAD 180 with respect to time according to an embodiment of the present invention. Referring to FIG. 19B, the bias includes the AC bias and the DC bias measured between input terminals 1960a-b and a ground potential. As shown in FIG. 19B, the DC bias applied at input terminals 1910a-b is 0.7V, and the AC bias applied at input terminals 1910a-b is 0.6V peak-to-peak. Thus, the amplitude of the AC bias is 0.3V, and the gate-to-source voltage $v_{gs}$ oscillates between 0.4V and 1.0V.

According to an embodiment, the bias corresponds with a gate-to-source voltage $v_{gs}$ of PAD 180, as shown in FIG. 19A. In the following discussion, the bias will be described with respect to the gate-to-source voltage $v_{gs}$ of PAD 180, though the scope of the invention is not limited in this respect.

FIG. 19C shows an example plot 1900 of a relationship between the input capacitance $C_g$ of PAD 180 and a gate-to-source voltage ($v_{gs}$) of PAD 180 according to an embodiment of the present invention. As illustrated by FIG. 19C, a variation of $v_{gs}$ causes the input capacitance $C_g$ of PAD 180 to change. Changing the input capacitance $C_g$ of PAD 180 causes the resonant frequency $f_{res}$ of equivalent circuit 1200 to change and the impedance $Z_{1010}$ at the output of PGA to change. In an embodiment, a desired bias of PAD 180 is determined by varying the bias and monitoring the input capacitance $C_g$, the resonant frequency $f_{res}$, and/or the impedance $Z_{1010}$.

The input capacitance $C_g$ of PAD 180 is directly proportional to the size of PAD 180. The size of PAD 180 is based on the number of gates that are used to amplify an input signal received by PAD 180, the gate width, and/or the gate length. According to an embodiment, a larger PAD 180 corresponds with a higher input capacitance $C_g$, meaning that a given $v_{gs}$ corresponds with a higher input capacitance $C_g$ for the larger PAD 180.

5.0 EXAMPLE PGA/PAD BIASING POINTS

FIG. 20 illustrates an example biasing point A of PAD 180 in plot 1900 of FIG. 19C according to an embodiment of the present invention. Referring to FIG. 20, PAD 180 has a gate-to-source voltage $v_{gs}$ of approximately 0.75V at biasing point A, corresponding to an input capacitance $C_g$ of approximately 720 fF. The gate-to-source voltage $v_{gs}$ is a moving signal having a direct current (DC) component ($v_{gsDC}$) and an alternating current (AC) component ($v_{gsAC}$). The DC and AC components can be any of a variety of values. In the embodiment of FIG. 20, the DC component $v_{gsDC}$ is 0.75V. The AC component $v_{gsAC}$ can be 0.5V, for purposes of illustration. The gate-to-source voltage $v_{gs}$ in FIG. 20, therefore, varies between 0.5V and 1.0V.

As $v_{gs}$ varies from peak to peak, the input capacitance $C_g$ of PAD 180 varies accordingly. In FIG. 20, $v_{gs}$=0.5V corresponds to $C_g$=440 fF, and $v_{gs}$=1.0V corresponds to $C_g$=740 fF. Thus, the input capacitance $C_g$ of PAD 180 varies between 440 fF and 740 fF for $v_{gs}$=0.75±0.25V.

Referring to FIG. 20, as the amplitude of the AC component $v_{gsAC}$ increases, the average input capacitance $C_{gAVE}$ of PAD 180 decreases, as shown in FIG. 21. For PAD 180 biased at point A, if the amplitude of the AC component $v_{gsAC}$ is zero, then the average input capacitance $C_{gAVE}$ is approximately 720 fF. It can be seen from FIG. 20 that when the AC component $v_{gsAC}$ is non-zero, a positive variation of $v_{gs}$ from biasing point A results in a relatively slight increase in $C_g$, and a corresponding negative variation of $v_{gs}$ results in a relatively substantial decrease in $C_g$. The average input capacitance $C_{gAVE}$ of PAD 180 progressively decreases as the amplitude of the AC component $v_{gsAC}$ is increased, until a biasing threshold is reached.

The biasing threshold corresponds with a stationary point of plot 1900. A stationary point is defined as a point on a curve at which the derivative of the function that defines the curve equals zero (i.e., a point on the curve at which the slope of the curve is zero). The term "stationary point" as used herein is further defined to include a point at which the slope of the curve is approximately zero and a point on the curve at which the slope is substantially less than the slope at other points on the curve.

In FIG. 20, the biasing threshold corresponds to the point in plot 1900 below which the slope of plot 1900 substantially decreases. The slope of plot 1900 substantially decreases when the gate-to-source voltage $v_{gs}$ of PAD 180 reaches approximately 0.45V. Thus, the point on plot 1900 that corresponds with $v_{gs}$=0.45V can be referred to as the lower biasing threshold of PAD 180.

In the embodiment of FIG. 20, the average input capacitance $C_{gAVE}$ begins to increase as the gate-to-source voltage $v_{gs}$ swings below approximately 0.45V. The AC component amplitude threshold $v_{thresh}$ is determined by subtracting the gate-to-source voltage $v_{gs}$ at the lower biasing threshold from the gate-to-source voltage $v_{gs}$ at biasing point A. In FIG. 20, the AC component amplitude threshold is 0.75V−0.45V=0.3V and is labeled in FIG. 21 as $v_{thresh}$.

FIG. 22 illustrates an example biasing point B of PAD 180 in plot 1900 of FIG. 19C according to an embodiment of the present invention. Referring to FIG. 22, PAD 180 has a gate-to-source voltage $v_{gs}$ of approximately 0.45V at biasing point B, corresponding to an input capacitance $C_g$ of approximately 420 fF. The gate-to-source voltage $v_{gs}$ has a DC component $v_{gsDC}$ of 0.45V. For the purposes of illustration, the gate-to-source voltage $v_{gs}$ can have an AC component $v_{gsAC}$ of 0.5V. The gate-to-source voltage $v_{gs}$ in FIG. 22, therefore, varies between 0.2V and 0.7V.

As $v_{gs}$ varies from peak to peak, the input capacitance $C_g$ of PAD 180 varies accordingly. In FIG. 22, $v_{gs}$=0.2V corresponds to $C_g$=420 fF, and $v_{gs}$=0.7V corresponds to $C_g$=700 fF. Thus, the input capacitance $C_g$ of PAD 180 varies between 420 fF and 700 fF for $v_{gs}$=0.45±0.25V.

Referring to FIG. 22, as the amplitude of the AC component $v_{gsAC}$ increases, the average input capacitance $C_{gAVE}$ of PAD 180 increases, as shown in FIG. 23. For PAD 180 biased at point B, if the amplitude of the AC component $v_{gsAC}$ is zero, then the average input capacitance $C_{gAVE}$ is approximately 420 fF. It can be seen from FIG. 22 that when the AC component $v_{gsAC}$ is non-zero, a positive variation of $v_{gs}$ results in a relatively substantial increase in $C_g$, and a corresponding negative variation of $v_{gs}$ from biasing point B results in a relatively negligible change in $C_g$. The average input capacitance $C_{gAVE}$ of PAD 180 progressively increases as the amplitude of the AC component $v_{gsAC}$ is increased, until a biasing threshold is reached.

In FIG. 22, the biasing threshold corresponds to the point in plot 1900 above which the slope of plot 1900 substantially decreases. The slope of plot 1900 substantially decreases when the gate-to-source voltage $v_{gs}$ of PAD 180 reaches approximately 0.75V. Thus, the point on plot 1900 that corresponds with $v_{gs}$=0.75V can be referred to as the upper biasing threshold of PAD 180.

In the embodiment of FIG. 22, the input capacitance $C_{gAVE}$ of PAD 180 does not increase substantially for gate-to-source voltages greater than approximately 0.75V. The AC component amplitude threshold $v_{thresh}$ is determined by subtracting the gate-to-source voltage $v_{gs}$ at biasing point B from the gate-to-source voltage $v_{gs}$ at the point in plot 1900 above which the slope of plot 1900 substantially decreases. In FIG. 22, the AC component amplitude threshold is 0.75V−0.45V=0.3V and is labeled in FIG. 23 as $v_{thresh}$. The AC component amplitude thresholds corresponding to biasing points A and B in FIGS. 20 and 22 need not necessarily be the same, though they are the same in this instance.

6.0 EMBODIMENTS HAVING MULTIPLE PADS

Nonlinearities associated with the magnitude response and/or the phase response of transmitter 100 can be reduced or eliminated in any of a variety of ways. For example, the magnitude and/or phase response of transmitter 100 can be improved by reducing nonlinearities associated with the average input capacitance $C_{gAVE}$ of PAD 180. According to an embodiment, transmitter 100 includes multiple PADs to provide a more linear magnitude and/or phase response.

FIG. 24 illustrates amplifier block 140 of FIG. 1 in which PAD 180 includes two PADs 2410a and 2410b according to an embodiment of the present invention. Referring to FIG. 24, PADs 2410a and 2410b are connected in parallel. The sensitivity of the average input capacitance $C_{gAVE}$ of PAD 180 to bias variations can be reduced by biasing PADs 2410a and 2410b differently from each other. In the embodiment of FIG. 24, PAD 2410a is biased at biasing point A, as shown in FIG. 20. The average input capacitance of PAD 2410a ($C_{gAVE1}$) can be represented by plot 2100 in FIG. 21. Pad 2410b is biased at biasing point B, as shown in FIG. 22. The average input capacitance of PAD 2410b ($C_{gAVE2}$) can be represented by plot 2300 in FIG. 23.

FIG. 25 shows a plot 2500 of the average input capacitance $C_{gAVE}$ of PAD 180 having PADs 2410a and 2410b according to an embodiment of the present invention. Referring to FIG. 25, the average input capacitance $C_{gAVE}$ of PAD 180, represented by plot 2500, equals the sum of the average input capacitance of PAD 2410a ($C_{gAVE1}$), represented by plot 2100, and the average input capacitance of PAD 2410b ($C_{gAVE2}$), represented by plot 2300. In other words, $C_{gAVE}$=$C_{gAVE1}$+$C_{gAVE2}$.

As shown in FIG. 25, nonlinearities in plot 2100 correspond to opposing nonlinearities in plot 2300. For example, the average input capacitance of PAD 2410a ($C_{gAVE1}$) is at a maximum at $v_{gsAC1}$=0V in plot 2100, and the average input capacitance of PAD 2410b ($C_{gAVE2}$) is at a minimum at $v_{gsAC2}$=0V in plot 2300. The average input capacitance of PAD 2410a ($C_{gAVE1}$) decreases as the amplitude of $v_{gsAC1}$ increases in plot 2100, and the average input capacitance of PAD 2410b ($C_{gAVE2}$) increases as the amplitude of $v_{gsAC2}$ increases in plot 2300.

In FIG. 25, the nonlinearities associated with the average input capacitance of PAD 2410a ($C_{gAVE1}$) compensate for the nonlinearities associated with the average input capacitance of PAD 2410b ($C_{gAVE2}$), and vice versa, to provide a substantially constant overall average input capacitance $C_{gAVE}$ for PAD 180. In the embodiment of FIG. 25, plots 2100 and 2300 combine to provide an overall average input capacitance $C_{gAVE}$ of approximately 1140 fF, regardless of the amplitude of the AC component of the bias signal applied to PAD 180. In FIG. 25, the effect of biasing variations on the average input capacitance $C_{gAVE}$ of PAD 180 is substantially negligible.

Reducing the correlation between biasing variations and input capacitance improves the phase response of PAD 180. Configuring transmitter 100 to have multiple PADs, such as PADs 2410a and 2410b in FIG. 24, reduces the correlation between the gate-to-source voltages $v_{gs1}$ and $v_{gs2}$ of respective PADs 2410a-b and respective average input capacitances $C_{gAVE1}$ and $C_{gAVE2}$, as shown in plot 2500 of FIG. 25. Utilizing multiple PADs that are configured at different biasing points therefore reduces the phase distortion of PAD 180. The reduction of phase distortion can be determined graphically by plotting an output of PAD 180 using a constellation, as described above with reference to FIGS. 2-5. Plotting the output of PAD 180 provides an output constellation in which all points in the output constellation have the same input capacitance and the same phase response, meaning that PAD 180 has substantially no phase distortion.

FIG. 26 illustrates biasing values available for a transmitter utilizing multiple PADs as compared to biasing values available for a traditional transmitter utilizing a single PAD according to an embodiment of the present invention. For a transmitter that includes PADs 2410a and 2410b, for example, Bias1 represents the biasing values at which PAD 2410a may be biased, and Bias2 represents the biasing values at which PAD 2410b may be biased. In a traditional transmitter, however, Bias1=Bias2 because traditional transmitters include only one PAD. Dashed line 2610 represents the biasing points at which a traditional transmitter may be biased. It is unlikely that a biasing point along dashed line 2610 corresponds to a constant average input capacitance $C_{gAVE}$. Thus, it is likely that the single PAD of the traditional transmitter has a non-linear phase response.

Biasing values B, aB, Ab, and A are provided along each axis of plot 2600. Biasing value B corresponds with class B operation. Biasing values aB and Ab each correspond with class AB operation. Biasing value A corresponds with class A operation. PADs 2410a and 2410b may be biased at any point in graph 2600. PADs 2410a and 2410b need not necessarily be biased at the same biasing values. For example, biasing point (Ab,aB) indicates that PAD 2410a may be biased at biasing value Ab, and PAD 2410b may be biased at biasing value aB. PADs 2410a and 2410b can be biased at a biasing point that is not represented by the intersection of gridlines 2620 in graph 2600.

According to an embodiment, varying the biasing point of PADs 2410a and 2410b in FIG. 26 changes the error vector magnitude (EVM) of transmitter 100. The EVM represents a comparison of a receive constellation to a transmit constellation. For example, the EVM indicates how closely the transmit constellation of transmitter 100 relates to the receive constellation of transmitter 100 at a particular output power. A lower EVM corresponds to a lower phase distortion. Thus, a three-dimensional plot of EVM v. Bias1 v. Bias2 can be used to determine a desired biasing point for PADs 2410a and 2410b.

Flowchart 2700 illustrates a method of providing a substantially linear phase response. The invention, however, is not limited to the description provided by flowchart 2700. Rather, it will be apparent to persons skilled in the relevant art(s) from the teachings provided herein that other functional flows are within the scope and spirit of the present invention.

Flowchart 2700 will be described with continued reference to example transmitter 100 described above in reference to FIG. 1, though the method is not limited to that embodiment.

Referring now to FIG. 27, first and second power amplifier drivers (PADs) 180a-b are biased at step 2710 to have respective first and second non-linear phase responses. In the embodiment of FIG. 27, first and second PADs 180a-b are coupled in parallel with each other. The first and second non-linear phase responses are combined at step 2720 to provide a combined substantially linear phase response.

According to an embodiment, step 2710 includes biasing first and second PADs 180a-b at respective first and second gate-to-source voltages. In an embodiment, step 2710 includes varying a first average input capacitance $C_{gAVE1}$ of first PAD 180a and varying second average input capacitance $C_{gAVE2}$ of second PAD 180b. Step 2720 may provide a combined average input capacitance $C_{gAVE}$ that is substantially insensitive to varying the first average input capacitance $C_{gAVE1}$ and varying the second average input capacitance $C_{gAVE2}$.

In an embodiment, step 2710 may include biasing first PAD 180a using a first bias to provide a first average input capacitance $C_{gAVE1}$ that is directly proportional to an amplitude of an oscillation of the first bias and biasing second PAD 180b using a second bias to provide a second average input capacitance $C_{gAVE2}$ that is inversely proportional to an amplitude of an oscillation of the second bias. Step 2720 may provide a combined average input capacitance $C_{gAVE}$ that is substantially insensitive to the amplitudes of the oscillations of the first and second biases.

Biasing first and second PADs 180a-b at step 2710 provides a substantially linear magnitude response, according to an embodiment. Step 2710 may include biasing first PAD 180a at approximately a lower biasing threshold of first PAD 180a and biasing second PAD 180b at approximately an upper biasing threshold of second PAD 180b.

7.0 CONCLUSION

Example embodiments of the methods, systems, and components of the present invention have been described herein. As noted elsewhere, these example embodiments have been described for illustrative purposes only, and are not limiting. Other embodiments are possible and are covered by the invention. Such other embodiments will be apparent to persons skilled in the relevant art(s) based on the teachings contained herein. Thus, the breadth and scope of the present invention should not be limited by any of the above described exemplary embodiments, but should be defined only in accordance with the following claims and their equivalents.

What is claimed is:

1. A transmitter that is configured to transmit an input signal, comprising: a first power amplifier driver (PAD) having a corresponding first input capacitance, wherein a first bias is applied to the first PAD so that the first input capacitance increases as an amplitude of the input signal increases; and a second PAD having a corresponding second input capacitance, wherein a second bias is applied to the second power amplifier driver so that the second input capacitance decreases as the amplitude of the input signal increases; wherein respective outputs of the first PAD and the second PAD are combined to form an output for the transmitter.

2. The transmitter of claim 1, wherein the first bias is a gate-to-source voltage for a first input transistor of the first PAD, and wherein the second bias is a gate-to-source voltage for a second input transistor of the second PAD.

3. The transmitter of claim 1, wherein a parallel combination of the first and second PADs has a combined average input capacitance that is substantially insensitive to an amplitude of the input signal.

4. The transmitter of claim 1, wherein the first PAD has a first average input capacitance that is directly proportional to a signal swing amplitude about the first bias, and wherein the second PAD has a second average input capacitance that is inversely proportional to a signal swing amplitude about the second bias, and wherein a parallel combination of the first and second PADs has a combined average input capacitance that is substantially insensitive to the signal swing amplitudes about the first and second biases.

5. The transmitter of claim 1, wherein the first bias and the second bias are selected based on an error vector magnitude associated with the transmitter.

6. The transmitter of claim 5, wherein the error vector magnitude represents a phase distortion associated with the transmitter, wherein said first bias and second bias are selected to reduce the phase distortion.

7. The transmitter of claim 1, wherein the first PAD operates in a class Ab, and wherein the second PAD operates in a class of bA.

8. The transmitter of claim 1, wherein the transmitter has a substantially linear magnitude response.

9. The transmitter of claim 1, wherein the first bias corresponds to a lower biasing threshold of the first PAD, and wherein the second bias corresponds to an upper biasing threshold of the second PAD.

10. The transmitter of claim 1, wherein the transmitter further comprises:
a programmable gain amplifier having an output coupled to inputs of the first and second PADs; and first and second up-converters having outputs combined and provided to an input of the programmable gain amplifier.

11. A method of transmitting an input signal, comprising:
biasing first and second power amplifier drivers (PADs) with respective first and second biases so that: (1) an input capacitance of the first PAD increases as an amplitude of the input signal increases; and (2) an input capacitance of the second PAD decreases as the amplitude of the input signal increases; and
combining outputs of the first and second PADs.

12. The method of claim 11, wherein biasing the first and second PADs includes biasing gate-to-source voltages of respective first and second input transistors that correspond to the respective first and second PADs.

13. The method of claim 11, wherein biasing the first and second PADs includes varying a first average input capacitance of the first PAD and varying a second average input capacitance of the second PAD, and wherein combining the first and second non-linear phase responses provides a combined average input capacitance that is substantially insensitive to said varying the first average input capacitance and said varying the second average input capacitance.

14. The method of claim 11, wherein biasing the first and second PADs includes biasing the first PAD using a first bias and biasing the second PAD using a second bias, the method further comprising selecting the first bias and the second bias based on an error vector magnitude associated with the first bias and the second bias.

15. The method of claim 14, wherein the error vector magnitude represents a phase distortion associated with the transmitting the input signal, wherein said first bias and second bias are selected to reduce the phase distortion.

16. The method of claim 11, wherein said step of biasing includes:
biasing the first PAD to operate in a class Ab; and
biasing the second PAD to operate in a class bA.

17. The method of claim 11, wherein biasing the first and second PADs includes biasing the first PAD at approximately a lower biasing threshold of the first PAD and biasing the second PAD at approximately an upper biasing threshold of the second PAD.

* * * * *